(12) United States Patent
Shoeb et al.

(10) Patent No.: US 12,068,131 B2
(45) Date of Patent: *Aug. 20, 2024

(54) MULTI-LEVEL PARAMETER AND FREQUENCY PULSING WITH A LOW ANGULAR SPREAD

(71) Applicant: Lam Research Corporation, Fremont, CA (US)

(72) Inventors: Juline Shoeb, Fremont, CA (US); Alex Paterson, San Jose, CA (US); Ying Wu, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 5 days.

This patent is subject to a terminal disclaimer.

(21) Appl. No.: 17/942,040

(22) Filed: Sep. 9, 2022

(65) Prior Publication Data

US 2023/0005718 A1 Jan. 5, 2023

Related U.S. Application Data

(63) Continuation of application No. 16/783,721, filed on Feb. 6, 2020, now Pat. No. 11,462,390, which is a continuation of application No. 16/275,008, filed on Feb. 13, 2019, now Pat. No. 10,573,494, which is a continuation of application No. 15/928,039, filed on Mar. 21, 2018, now Pat. No. 10,224,183.

(51) Int. Cl.
*H05H 1/46* (2006.01)
*H01J 37/32* (2006.01)

(52) U.S. Cl.
CPC .. *H01J 37/32146* (2013.01); *H01J 37/32183* (2013.01); *H01J 2237/327* (2013.01); *H01J 2237/334* (2013.01)

(58) Field of Classification Search
CPC ........... H01J 37/32146; H01J 37/32183; H01J 2237/327; H01J 2237/334
See application file for complete search history.

(56) References Cited

U.S. PATENT DOCUMENTS

| 9,123,509 | B2 | 9/2015 | Papasouliotis et al. | |
| 9,536,749 | B2 | 1/2017 | Marakhtanov et al. | |
| 10,224,183 | B1* | 3/2019 | Shoeb | H01J 37/32146 |
| 10,573,494 | B2* | 2/2020 | Shoeb | H01J 37/32146 |
| 11,462,390 | B2* | 10/2022 | Shoeb | H01J 37/32183 |
| 2017/0103872 | A1* | 4/2017 | Howald | H01J 37/32183 |

FOREIGN PATENT DOCUMENTS

KR 20140035860 A 3/2014

* cited by examiner

*Primary Examiner* — Minh D A
(74) *Attorney, Agent, or Firm* — PENILLA IP, APC

(57) ABSTRACT

Systems and methods for multi-level pulsing of a parameter and multi-level pulsing of a frequency of a radio frequency (RF) signal are described. The parameter is pulsed from a low level to a high level while the frequency is pulsed from a low level to a high level. The parameter and the frequency are simultaneously pulsed to increase a rate of processing a wafer, to increase mask selectivity, and to reduce angular spread of ions within a plasma chamber.

25 Claims, 18 Drawing Sheets

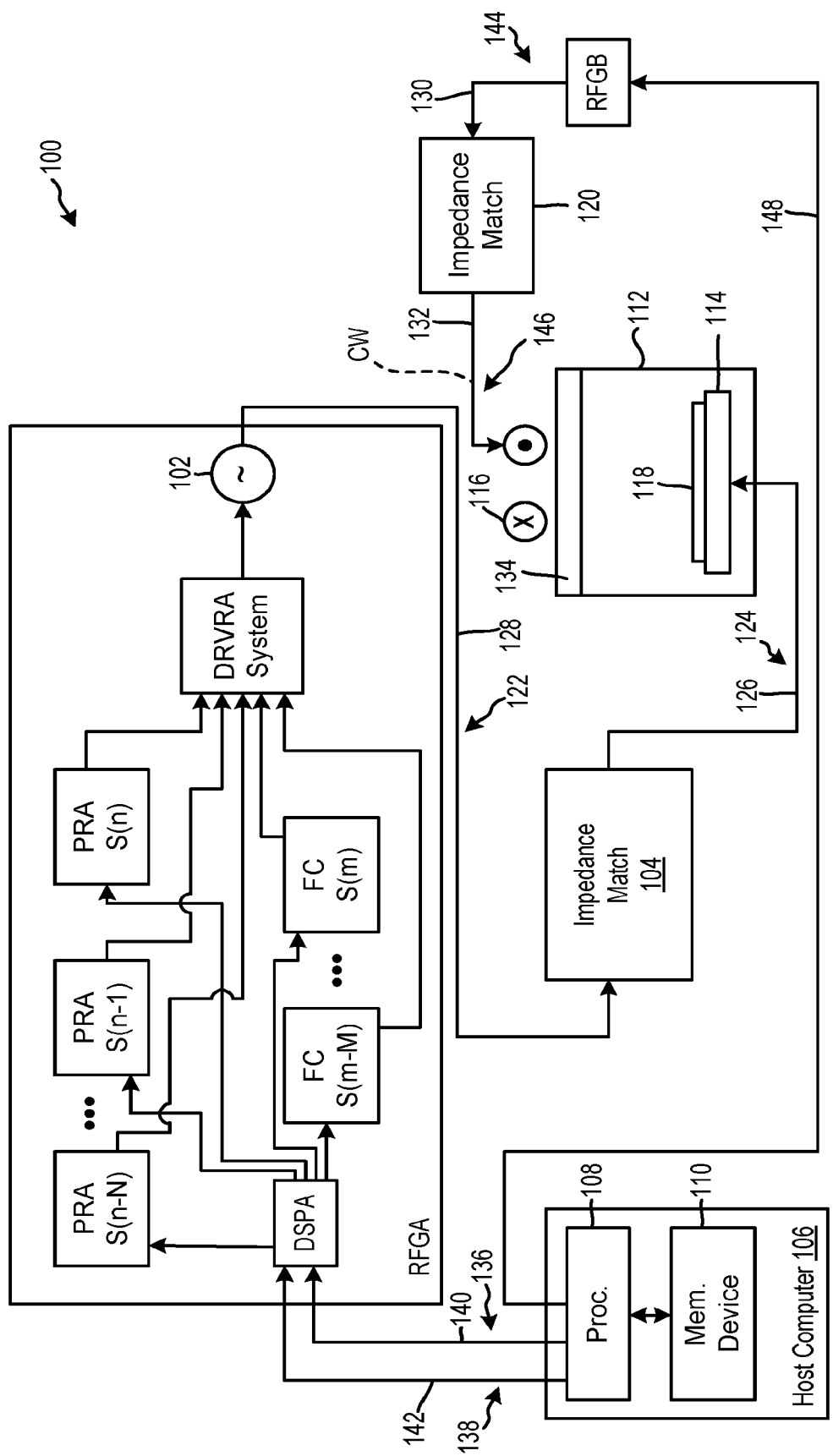
FIG. 1 (System) TCP is CW

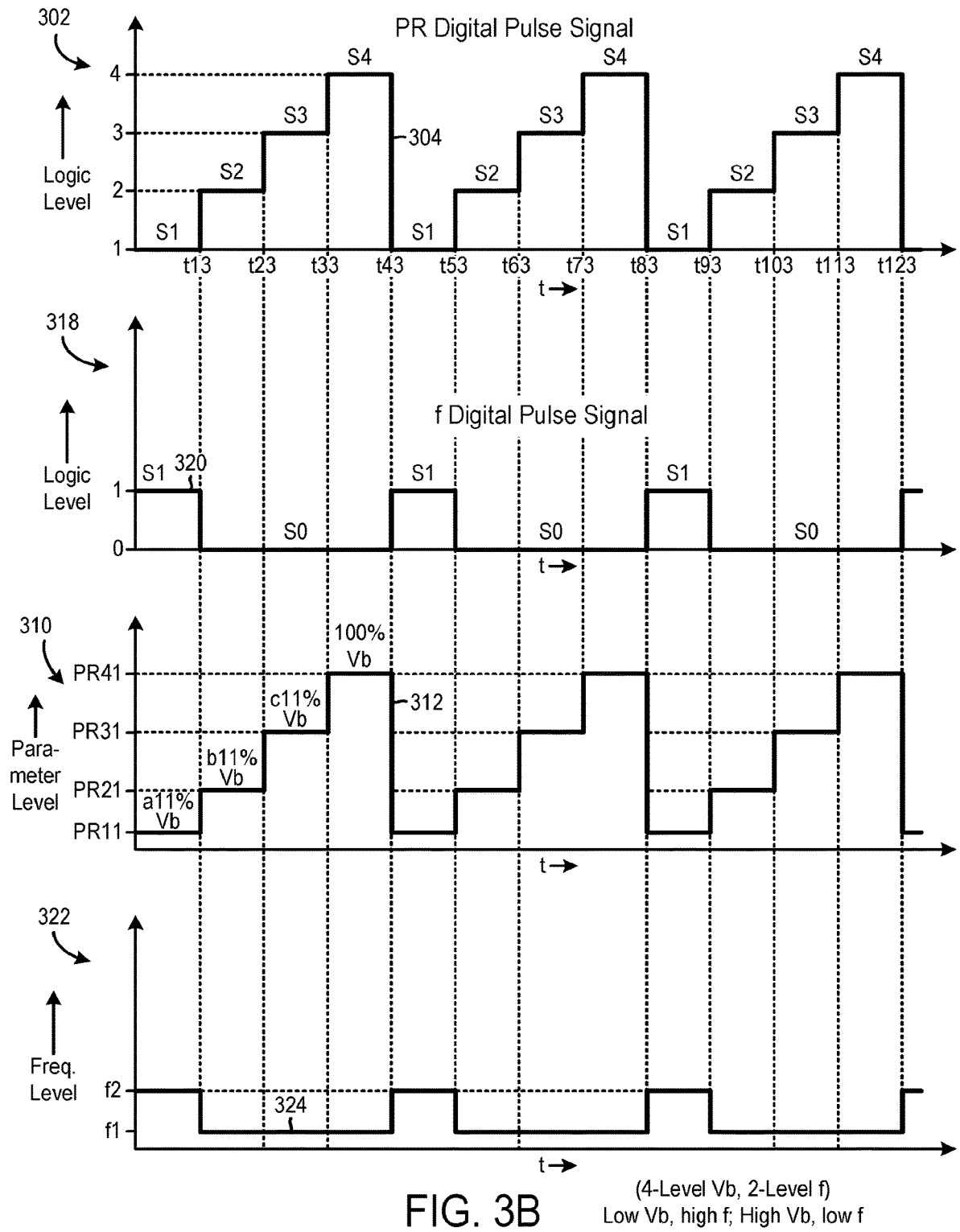
FIG. 3B  (4-Level Vb, 2-Level f)
Low Vb, high f; High Vb, low f

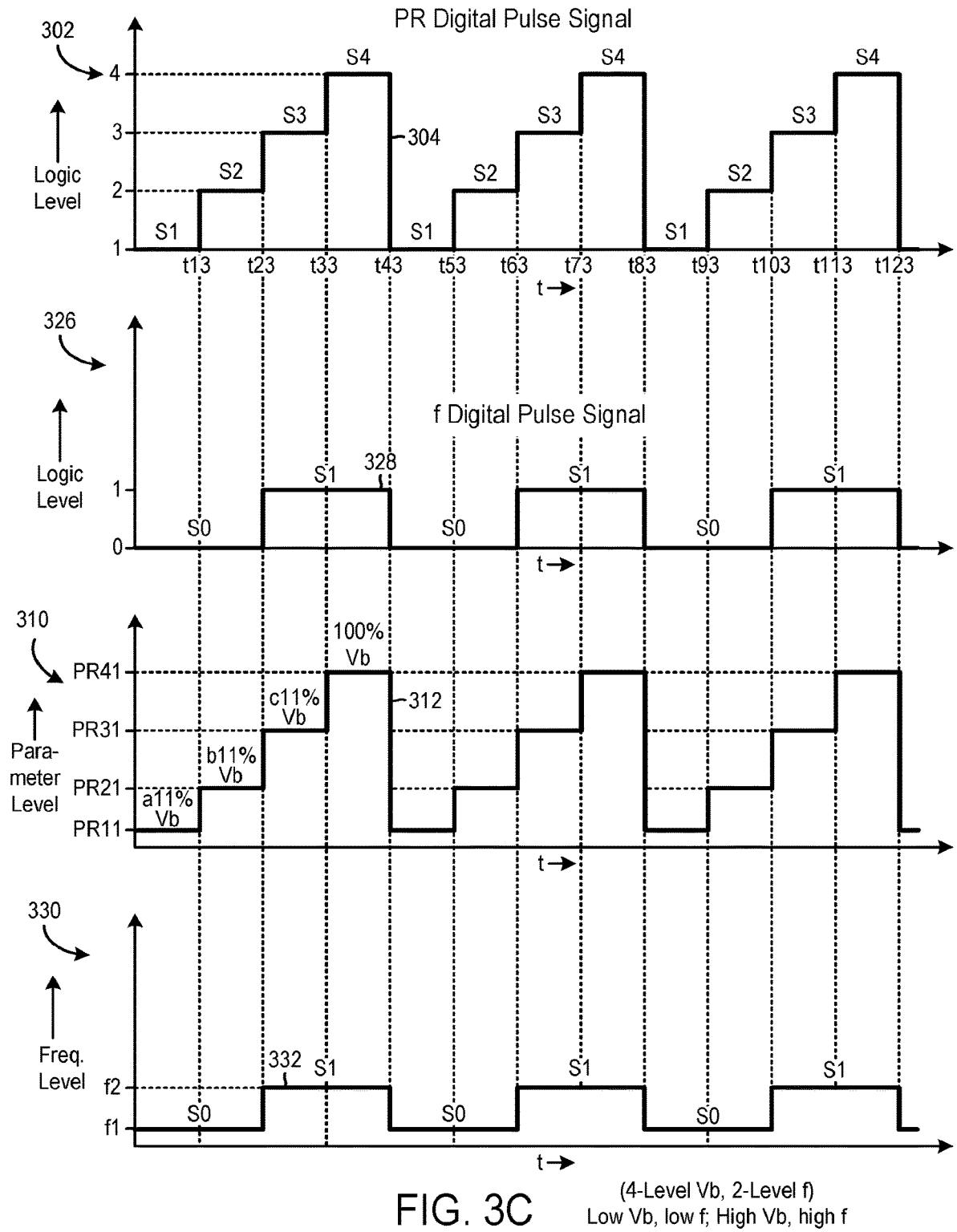
FIG. 3C  (4-Level Vb, 2-Level f)
Low Vb, low f; High Vb, high f (4-Level Vb, 2-Level f)
Low Vb, high f; High Vb, low f

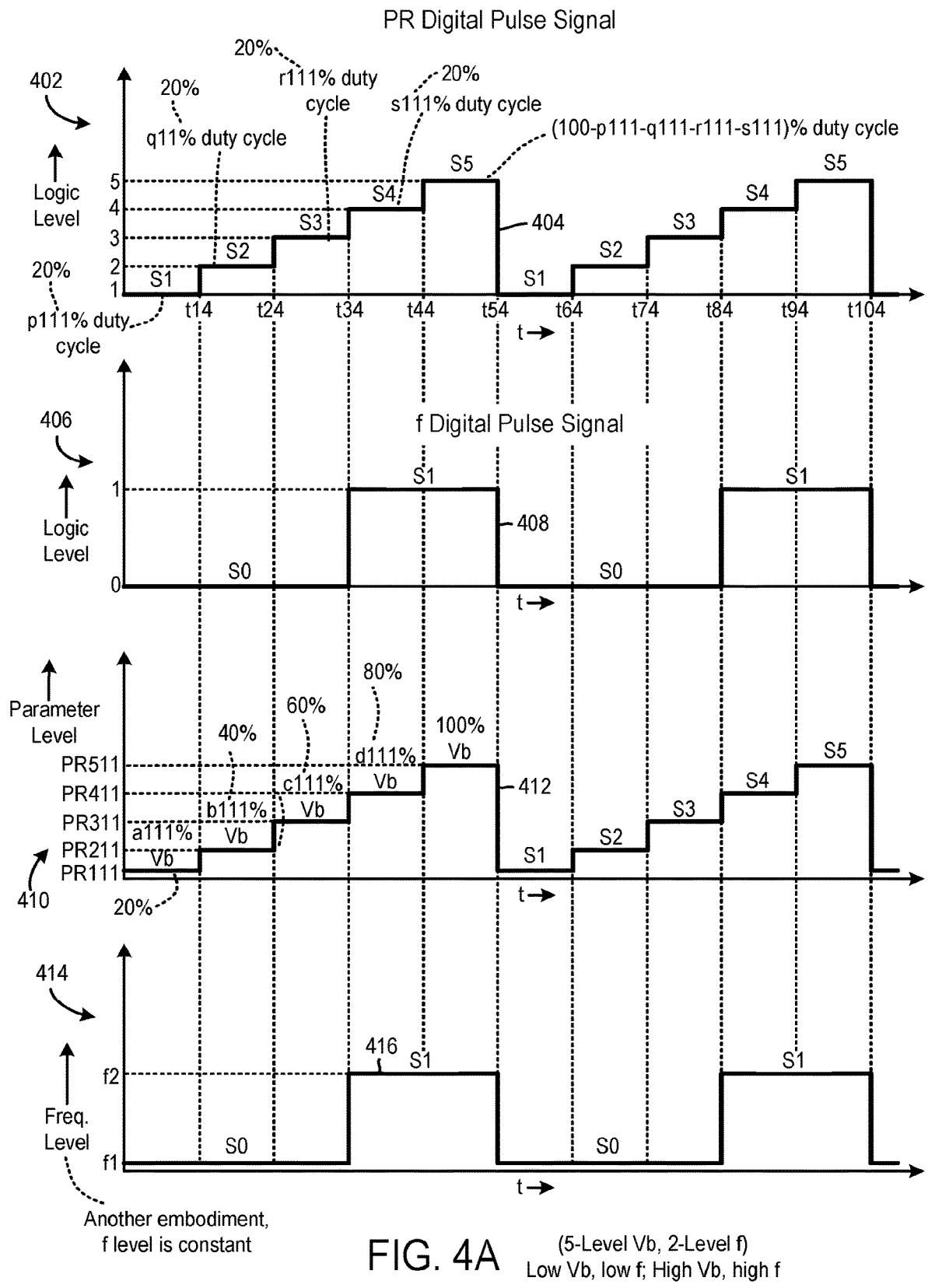
FIG. 4A (5-Level Vb, 2-Level f)
Low Vb, low f; High Vb, high f

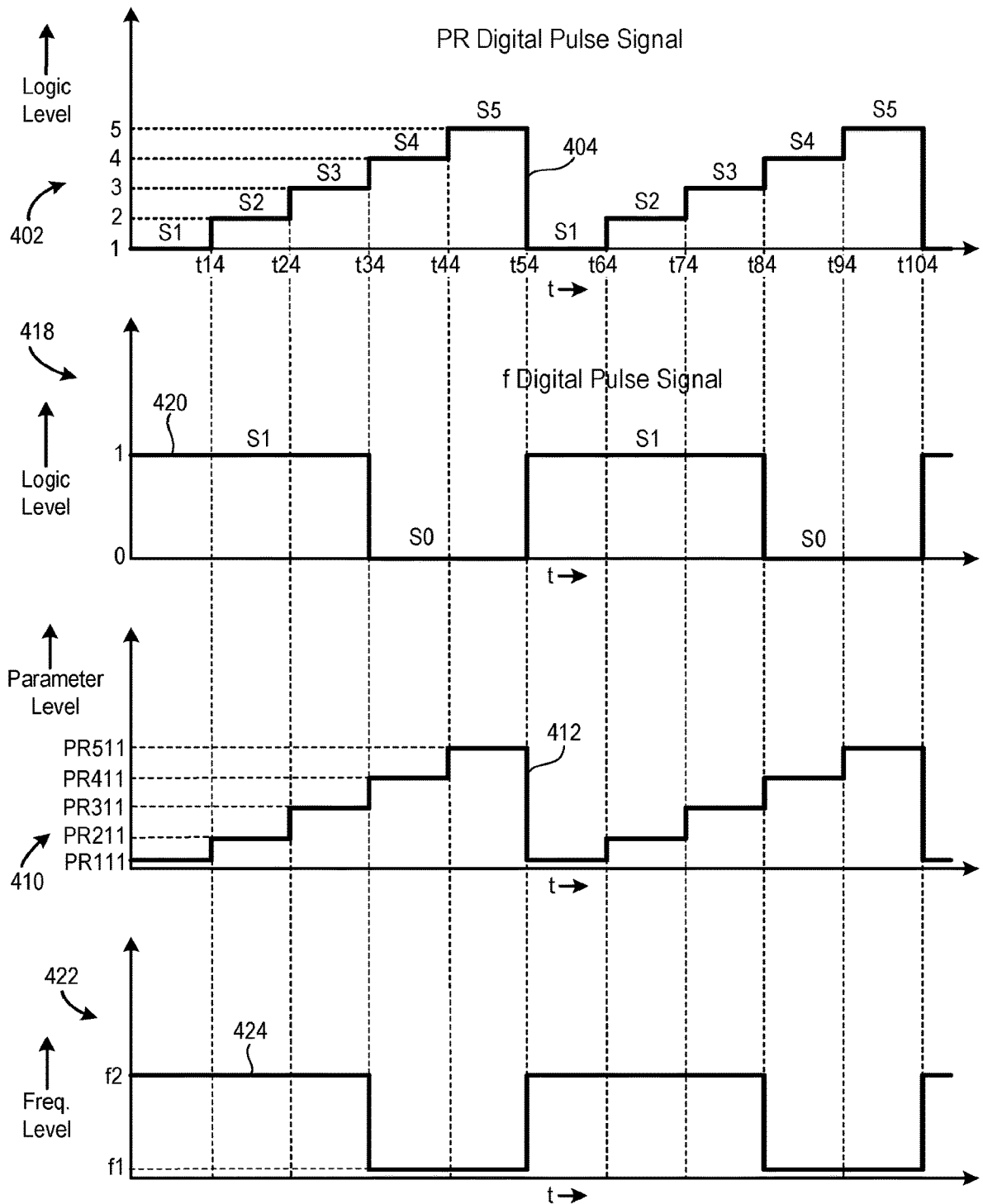
FIG. 4B (5-Level Vb; 2-Level f)
Low Vb, high f; High Vb, low f

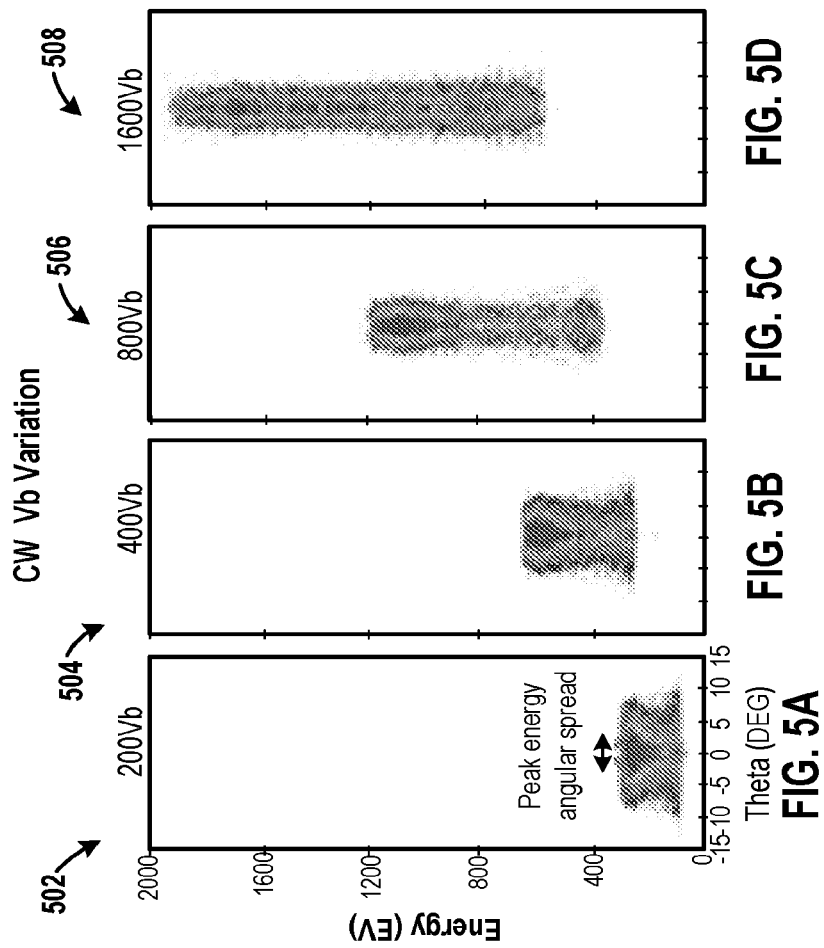

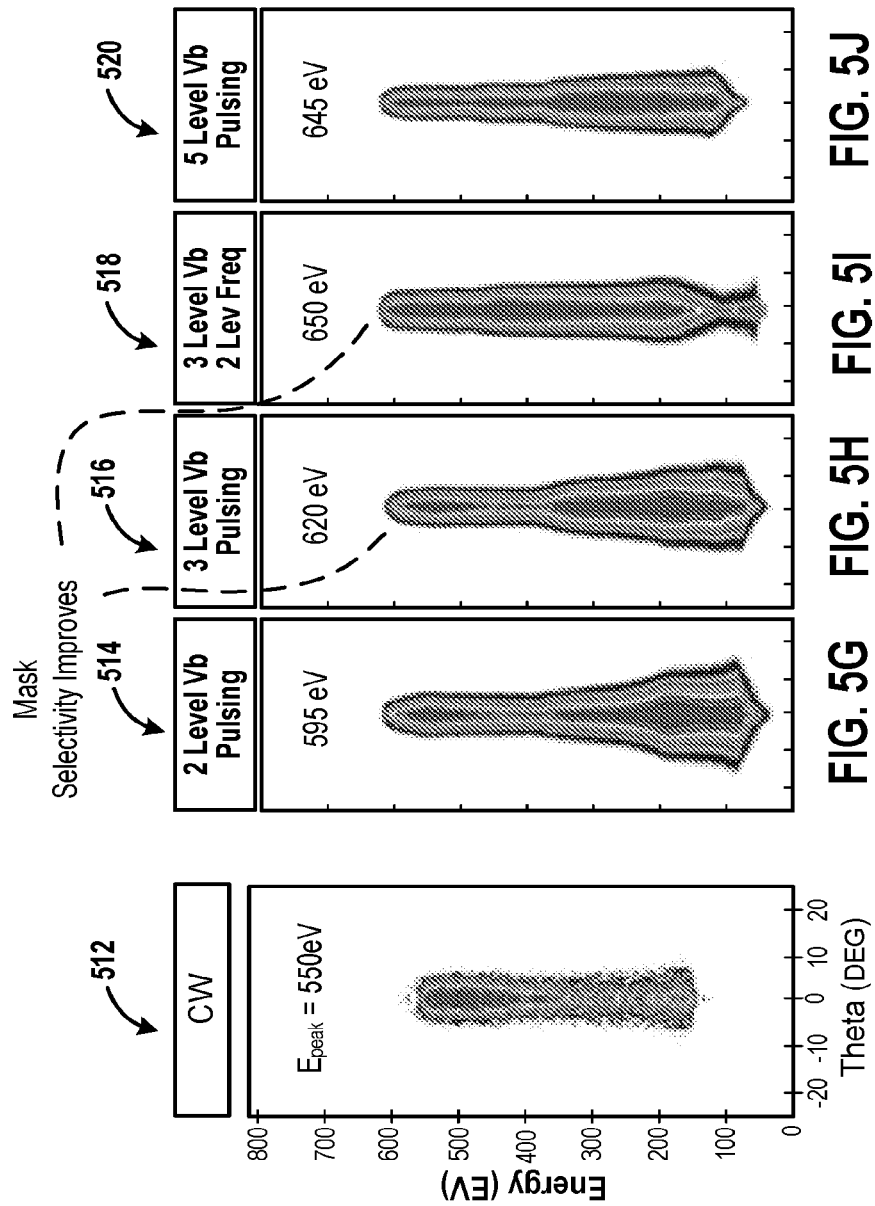

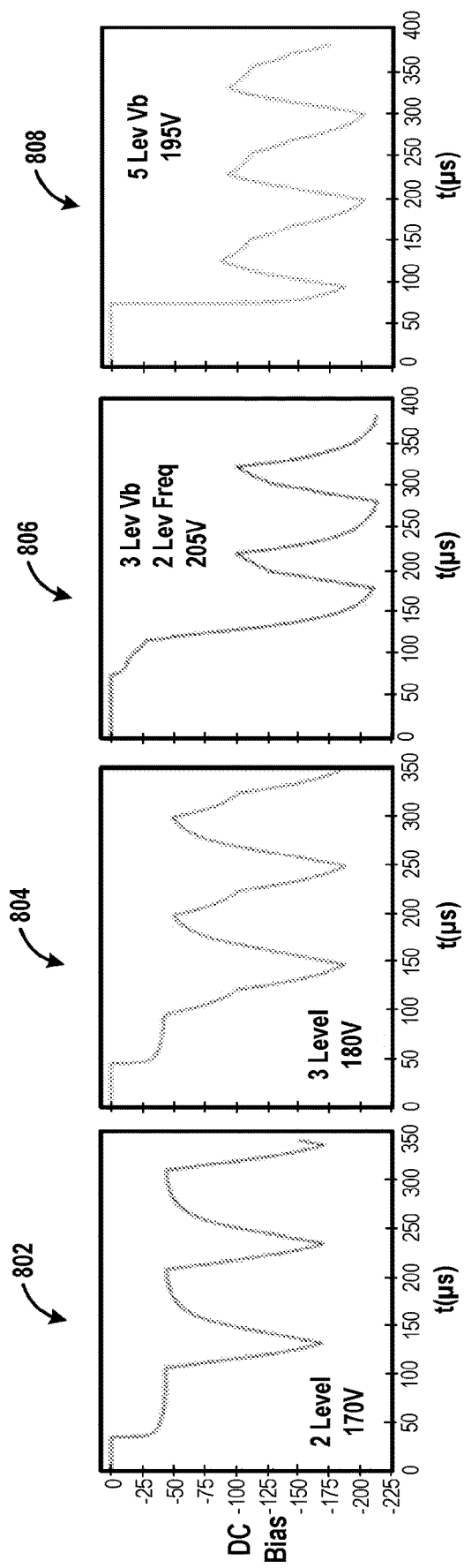

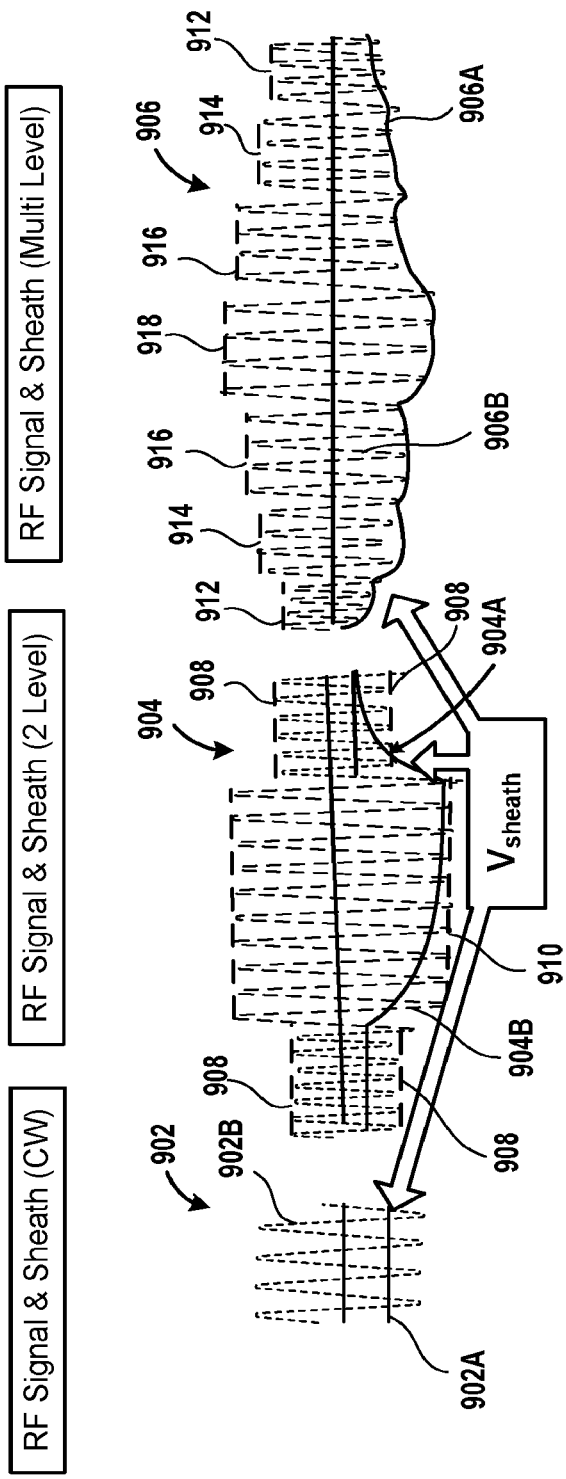

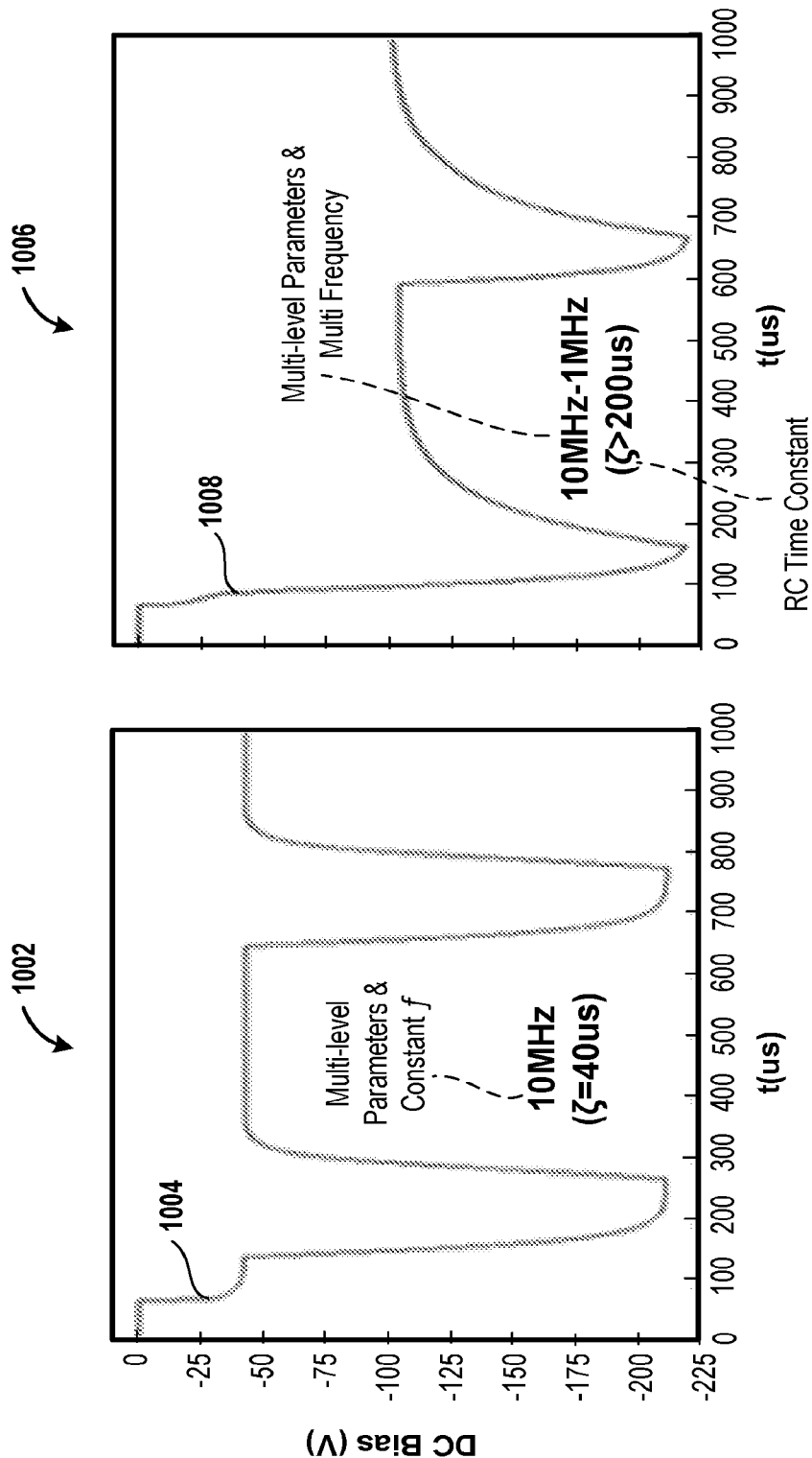

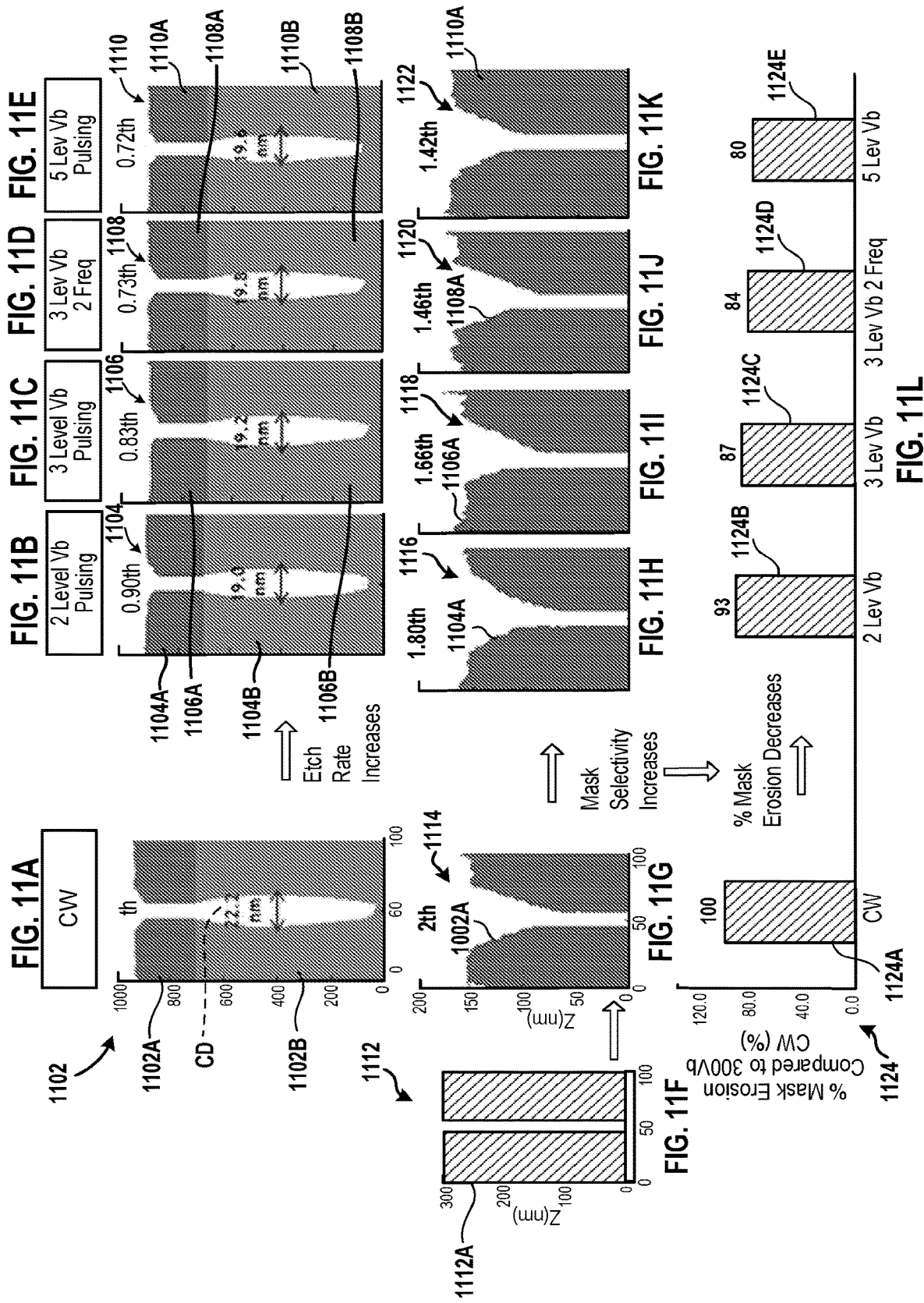

MULTI-LEVEL PARAMETER AND FREQUENCY PULSING WITH A LOW ANGULAR SPREAD

CLAIM OF PRIORITY

The present patent application is a continuation of and claims the benefit of and priority, under 35 U.S.C. § 120, to U.S. patent application having application Ser. No. 16/783,721, filed on the Feb. 6, 2020, and titled "Multi-level Parameter and Frequency Pulsing With a Low Angular Spread", which is a continuation of and claims the benefit of and priority, under 35 U.S.C. § 120, to U.S. patent application having application Ser. No. 16/275,008, filed on the Feb. 13, 2019, titled "Multi-level Parameter and Frequency Pulsing With a Low Angular Spread", and now issued as U.S. Pat. No. 10,573,494, which is a continuation of and claims the benefit of and priority, under 35 U.S.C. § 120, to U.S. patent application having application Ser. No. 15/928,039, filed on the Mar. 21, 2018, titled "Multi-level Parameter and Frequency Pulsing With a Low Angular Spread", and now issued as U.S. Pat. No. 10,224,183, all of which are incorporated by reference herein in their entirety.

CROSS-REFERENCE TO RELATED APPLICATIONS

The present patent application is related to U.S. patent application having application Ser. No. 15/928,029, filed on the Mar. 21, 2018, and titled "Multi-level Pulsing of DC and RF Signals", which is incorporated by reference herein in its entirety.

FIELD

The present embodiments relate to systems and methods for multi-level parameter and multi-level frequency pulsing with a low angular spread.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A plasma tool includes a radio frequency (RF) generator, and impedance matching circuit, and a plasma chamber. The RF generator generates a radio frequency waveform that is supplied to the impedance matching circuit. The impedance matching circuit receives the radio frequency waveform to output a radio frequency signal that is supplied to the plasma chamber. A wafer is processed within the plasma chamber by plasma generated when the radio frequency signal is supplied in conjunction with a process gas. For example, the wafer is etched within the plasma chamber pursuant to the radio frequency signal.

It is in this context that embodiments described in the present disclosure arise.

SUMMARY

Embodiments of the disclosure provide systems, apparatus, methods and computer programs for multi-level parameter and multi-level frequency pulsing with a low angular spread. It should be appreciated that the present embodiments can be implemented in numerous ways, e.g., a process, an apparatus, a system, a device, or a method on a computer readable medium. Several embodiments are described below.

To generate ions, such as both high energy and low energy ions, a radio frequency (RF) bias is increased at low frequency, such as 1 megahertz (MHz). The RF bias has a continuous waveform. The low energy ions have a low voltage and therefore, have a high angular spread. The high angular spread reduces an etch rate of etching a wafer.

With an increase in an amount of the RF bias, high aspect ratio etching is achieved. However, the increase in the amount of power increases mask erosion. Also, increasing the amount of RF bias greater than a pre-set amount, such as greater than approximately 5 kilovolts, does not reduce the angular spread due to high plasma sheath thickness.

By using multiple voltage levels, such as a high bias voltage that is greater than 500 volts, the angular spread is reduced but the low energy ions may still have relatively high energy, which is approximately 200 electron volts (eV). Applying the multiple voltage levels with multiple frequency levels decreases the angular spread in addition to reducing energy of the low energy ions to less than 100 electron volts. The low energy ions with the angular spread that is reduced protect a mask layer and simultaneously etch a substrate layer. The substrate layer has a lower etching threshold compared to the mask layer.

If the multiple voltage levels and multiple frequency levels with the high bias voltage are applied, the reduction in the energy of the low energy ions and of the angular spread occurs. For example, a low frequency level is applied with a low voltage level and a high frequency level is applied with a high voltage level. After a transition from the low frequency level to the high frequency level and from the low voltage level to the high voltage level, a high electric field is applied to the low energy ions by the high frequency level and the high voltage level. The high electric field is applied to the low energy ions because it takes time to change a plasma sheath associated with the low energy ions. Voltage magnitudes of the low voltage level apply a voltage boost to the low energy ions during the high voltage level. Also, the low energy ions have a low temperature because of the low voltage level. The high electric field increases velocity and energy of the low energy ions without substantially increasing the high voltage level to increase directionality of the low energy ions or reducing the angular spread of the low energy ions. For example, the angular spread is reduced, such as to approximately 1 degree from approximately 2 degrees. The directionality is also increased by the low temperature of the low energy ions. The increase in directionality facilitates piercing of plasma sheath to increase an etch rate of etching a substrate. A number of the multiple voltage levels and a duty cycle of each of the voltage levels are optimized for reducing the angular spread of the low energy ions.

Also, the high voltage level and the high frequency level of an RF signal create high energy ions having a low angular spread. The low voltage level and the low frequency level create the low energy ions that have a high angular spread. The high energy ions etch a feature of the substrate faster and the low energy ions improve mask selectivity.

The reduction in the angular spread increases the mask selectivity compared to that achieved by applying the continuous waveform, reduces critical dimension, such as a thickness, of a channel within the substrate compared to that achieved by applying the continuous waveform, and achieves better high aspect ratio etching of the substrate compared to that achieved by applying the continuous waveform. For example, the mask selectivity is improved by approximately 20% or more, the etch rate is increased by approximately 40% or more, and the critical dimension is reduced by approximately 12% or more compared to that achieved using the continuous waveform.

In some embodiments, a method is described. The method includes controlling an RF generator to generate an RF signal that concurrently pulses between a plurality of parameter levels and between a plurality of frequency levels during a time period. The plurality of parameter levels include a first parameter level and a second parameter level and the plurality of frequency levels include a first frequency level and a second frequency level. During the time period, a transition from the first frequency level to the second frequency level occurs in substantial synchronization with a transition from the first parameter level to the second parameter level and a transition from the second frequency level to the first frequency level occurs in substantial synchronization with a transition from the second parameter level to the first parameter level.

In various embodiments, a controller is described. The controller includes a processor configured to control an RF generator to generate an RF signal that concurrently pulses between a plurality of parameter levels and between a plurality of frequency levels during a time period. The plurality of parameter levels include a first parameter level and a second parameter level and the plurality of frequency levels include a first frequency level and a second frequency level. During the time period, a transition from the first frequency level to the second frequency level occurs in substantial synchronization with a transition from the first parameter level to the second parameter level and a transition from the second frequency level to the first frequency level occurs in substantial synchronization with a transition from the second parameter level to the first parameter level. The controller includes a memory device coupled to the processor.

In several embodiments, a system is described. The system includes an RF generator and a controller coupled to the RF generator. The controller is configured to control the RF generator to generate an RF signal that concurrently pulses between a plurality of parameter levels and between a plurality of frequency levels during a time period. The plurality of parameter levels include a first parameter level and a second parameter level. The plurality of frequency levels include a first frequency level and a second frequency level. During the time period, a transition from the first frequency level to the second frequency level occurs in substantial synchronization with a transition from the first parameter level to the second parameter level and a transition from the second frequency level to the first frequency level occurs in substantial synchronization with a transition from the second parameter level to the first parameter level.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 1 is a diagram of an embodiment of a system to illustrate an application of multi-level parameter pulsing and multi-level frequency pulsing.

FIG. 3B shows embodiments of the graphs to illustrate reverse two-level pulsing of the frequency of the RF signal compared to the four-level pulsing of the parameter of the RF signal.

FIG. 3C shows embodiments of graphs to illustrate two-level pulsing of the frequency of the RF signal and four-level pulsing of the parameter of the RF signal.

FIG. 4A shows embodiments of graphs to illustrate five-level pulsing of the parameter of the RF signal and two-level pulsing of the frequency of the RF signal.

FIG. 4B shows embodiments of graphs to illustrate reverse two-level pulsing of the frequency of the RF signal compared to five-level pulsing of the parameter of the RF signal.

FIG. 5A is an embodiment of a graph to illustrate an angular distribution of ions of plasma within a plasma reactor when a continuous wave voltage signal of 200 volts is applied as a bias voltage to a wafer support.

FIG. 5B is an embodiment of a graph to illustrate the angular distribution of ions of plasma within the plasma reactor when a continuous wave voltage signal of 400 volts is applied as the bias voltage to the wafer support.

FIG. 5C is an embodiment of a graph to illustrate the angular distribution of ions of plasma within the plasma reactor when a continuous wave voltage signal of 800 volts is applied as the bias voltage to the wafer support.

FIG. 5D is an embodiment of a graph to illustrate the angular distribution of ions of plasma within the plasma reactor when a continuous wave voltage signal of 1600 volts is applied as the bias voltage to the wafer support.

FIG. 5F is an embodiment of a graph to illustrate an energy of ions of plasma within the plasma reactor versus the angular distribution when a continuous wave voltage signal of 300 volts is applied to the wafer support.

FIG. 5G is an embodiment of a graph to illustrate an energy of ions of plasma within a plasma chamber when two-level pulsing of the parameter of the RF signal is applied to a substrate support and the RF signal has a constant frequency level.

FIG. 5H an embodiment of a graph to illustrate an energy of ions of plasma within the plasma chamber when three-level pulsing of the parameter of the RF signal is applied to the substrate support and the RF signal has the constant frequency level.

FIG. 5I is an embodiment of a graph to illustrate an energy of ions of plasma within the plasma chamber when three-level pulsing of the parameter of the RF signal is applied to the substrate support in addition to applying two-level pulsing of the frequency of the RF signal.

FIG. 5J is an embodiment of a graph to illustrate an energy of ions of plasma within the plasma chamber when five-level pulsing of the parameter of the RF signal is applied to the substrate support and the RF signal has the constant frequency level.

FIG. 8A is an embodiment of a graph that plots a direct current (DC) bias at the substrate support versus time t when the two-level pulsing of the parameter and the constant frequency level are applied to the substrate support.

FIG. 8B is an embodiment of a graph that plots the DC bias at the substrate support versus the time t when the three-level pulsing of the parameter and the constant frequency level are applied to the substrate support.

FIG. 8C is an embodiment of a graph that plots the DC bias at the substrate support versus the time t when the three-level pulsing of the parameter and the two-level pulsing of the frequency level are applied to the substrate support.

FIG. 8D is an embodiment of a graph that plots the DC bias at the substrate support versus the time t when the five-level pulsing of the parameter and the constant frequency level are applied to the substrate support.

FIG. 9A is an embodiment of a graph to illustrate a sheath voltage of plasma formed within the plasma reactor when a continuous wave voltage signal is applied to the wafer support.

FIG. 9B is an embodiment of a graph to illustrate a sheath voltage of plasma formed within the plasma chamber when the two-level pulsing of the parameter and the constant frequency level are applied to the substrate support.

FIG. 9C is an embodiment of a graph to illustrate a sheath voltage of plasma formed within the plasma chamber when the four-level pulsing of the parameter and the constant frequency level are applied to the substrate support.

FIG. 10A is an embodiment of a graph that plots the DC bias at the substrate support by the RF signal versus the time t when multi-level pulsing of the parameter and the constant frequency level are applied to the substrate support.

FIG. 10B is an embodiment of a graph that plots the DC bias at the substrate support by the RF signal versus the time t when multi-level pulsing of the parameter and the two-level pulsing of the frequency are applied to the substrate support.

FIG. 11A is an embodiment of a graph that plots a vertical distance across a wafer versus a horizontal distance across the wafer when a continuous wave voltage signal is applied to the wafer support of the plasma reactor.

FIG. 11B is an embodiment of a graph that plots the vertical distance across a substrate versus the horizontal distance across the substrate when the two-level pulsing of the parameter of the RF signal and the constant frequency level are applied to the substrate support.

FIG. 11C is an embodiment of a graph that plots the vertical distance across the substrate versus the horizontal distance across the substrate when the three-level pulsing of the parameter of the RF signal and the constant frequency level are applied to the substrate support.

FIG. 11D is an embodiment of a graph that plots the vertical distance across the substrate versus the horizontal distance across the substrate when the three-level pulsing of the parameter of the RF signal and the two-level pulsing of the frequency of the RF signal are applied to the substrate support.

FIG. 11E is an embodiment of a graph that plots the vertical distance across the substrate versus the horizontal distance across the substrate when the five-level pulsing of the parameter of the RF signal and the constant frequency level of the RF signal are applied to the substrate support.

FIG. 11F is an embodiment of a graph that plots the vertical distance across a mask layer of the substrate versus the horizontal distance across the mask layer of the substrate when the mask layer is not processed.

FIG. 11G is an embodiment of a graph that plots the vertical distance across the mask layer versus the horizontal distance across the mask layer when a continuous wave voltage signal is applied to the wafer support of the plasma reactor.

FIG. 11H is an embodiment of a graph that plots the vertical distance across the mask layer versus the horizontal distance across the mask layer when the two-level pulsing of the parameter of the RF signal and the constant frequency level are applied to the substrate support.

FIG. 11I is an embodiment of a graph that plots the vertical distance across the mask layer versus the horizontal distance across the mask layer when the three-level pulsing of the parameter of the RF signal and the constant frequency level are applied to the substrate support.

FIG. 11J is an embodiment of a graph that plots the vertical distance across the mask layer versus the horizontal distance across the mask layer when the three-level pulsing of the parameter of the RF signal and the two-level pulsing of the frequency of the RF signal are applied to the substrate support.

FIG. 11K is an embodiment of a graph that plots the vertical distance across the mask layer versus the horizontal distance across the mask layer when the five-level pulsing of the parameter of the RF signal and the constant frequency level of the RF signal are applied to the substrate support.

FIG. 11L is an embodiment of a graph to illustrate a decrease in mask erosion when multi-level pulsing of the parameter of the RF signal is applied in conjunction with the constant frequency level or multi-level pulsing of the parameter is applied in conjunction with the two-level pulsing of the frequency of the RF signal.

DETAILED DESCRIPTION

Figure 2A:
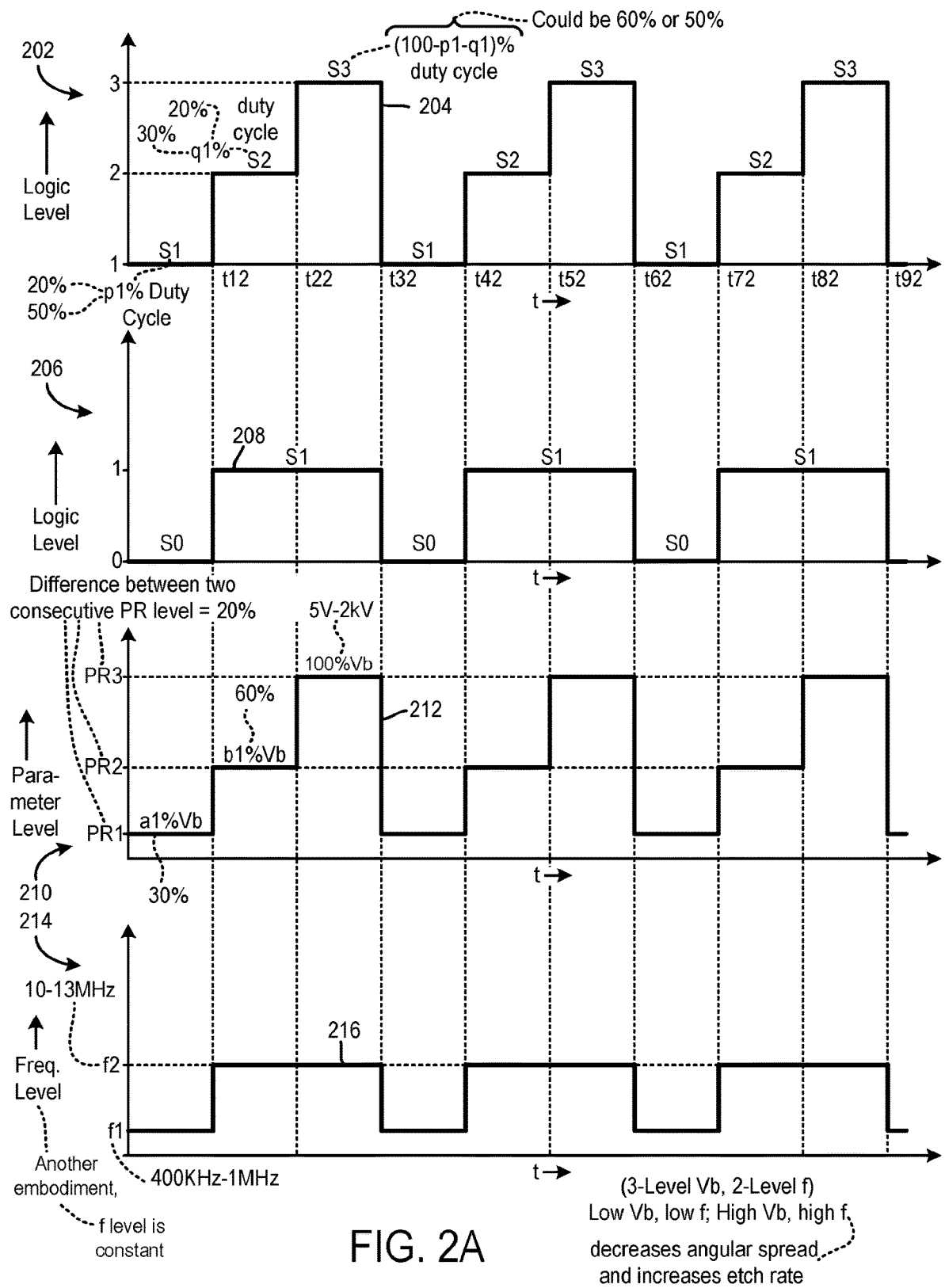
FIG. 2A shows embodiments of graphs to illustrate three-level pulsing of a parameter of a radio frequency (RF) signal generated by an RF generator and two-level pulsing of a frequency of the RF signal.

The following embodiments describe systems and methods for multi-level parameter and multi-level frequency pulsing with a low angular spread. It will be apparent that the present embodiments may be practiced without some or all of these specific details. In other instances, well known process operations have not been described in detail in order not to unnecessarily obscure the present embodiments.

FIG. 1 is a diagram of an embodiment of a system 100 to illustrate an application of multi-level parameter pulsing and multi-level frequency pulsing. The system 100 includes a radio frequency (RF) generator RFGA, and impedance match 104, a plasma chamber 112, another impedance match 120, another RF generator RFGB, a host computer 106, an RF cable 128, an RF transmission line 126, another RF cable 130, and another RF transmission line 132. Examples of the host computer 106 include a desktop computer, laptop computer, a server, a controller, a tablet, and a smart phone.

An impedance match, as described herein, includes a network of one or more resistors, or one or more capacitors, or one or more inductors, or a combination thereof, to match an impedance of a load coupled to an output of the impedance match with an impedance of a source coupled to an input of the impedance match. Examples of the load coupled to an output of impedance match 104 include the plasma chamber 112 and the RF transmission line 126. Moreover, examples of the source coupled to an input of the impedance match 104 include the RF cable 128 and the RF generator RFGA.

The host computer 106 includes a processor 108 and a memory device 110. As used herein, a processor is an application specific integrated circuit (ASIC), or a programmable logic device (PLD), or a central processing unit (CPU), or a microprocessor, or a microcontroller. As used herein, a controller is ASIC, or a PLD, or a CPU, or a microprocessor, or a microcontroller, or a processor. Examples of a memory device include a random access memory (RAM) and a read-only memory (ROM). To illustrate, a memory device is a flash memory, a hard disk, or a storage device, etc. A memory device is an example of a computer-readable medium.

The plasma chamber 112 includes a substrate support 114 on which a substrate 118 is placed for processing. The plasma chamber 112 further includes a dielectric window 134. Examples of the substrate support 114 include an electrostatic chuck and a wafer platen. The substrate support 114 includes a lower electrode, which is made from a metal, such as aluminum or an alloy of aluminum. A transformer coupled plasma (TCP) coil is situated outside the plasma chamber 112 over the dielectric window 134.

The RF generator RFGA includes a digital signal processor DSPA and multiple parameter controllers PRAS(n−N), PRAS(n−1), and PRAS(n), where N is an integer greater than zero. Examples of a parameter, as used herein, include voltage and power. The RF generator RFGA further includes multiple frequency controllers FCS(m−M) and FCS(m), where M is an integer greater than zero, such as 2, 3, 4, or 5. The RF generator RFGA further includes a driver system DRVRA and an RF power supply 102. An example of a driver system, as used herein, include one or more transistors. Another example of the driver system, as used herein, include one or more transistors that are coupled to an amplifier. An example of an RF power supply, as used herein, include an RF oscillator that generates a sinusoidal signal at a radio frequency, such as ranging from and including 400 kilohertz (kHz) to 100 megahertz (100 MHz).

The digital signal processor DSPA is coupled to the parameter controllers PRAS(n−N) through PRAS(n) and to the frequency controllers FCS(m−M) through FCS(m). Each of the parameter controllers PRAS(n−N) through PRAS(n) and to the frequency controllers FCS(m−M) through FCS(m) is coupled to the driver system DRVRA and the driver system DRVRA is coupled to the RF power supply 102. The processor 108 is coupled to the memory device 110 and to the digital signal processor DSPA.

The RF power supply 102 is coupled to the input of impedance match 104 via the RF cable 112. The output of the impedance match 102 is coupled to the substrate support 114. The RF generator RFGB includes an RF power supply that is coupled via the RF cable 132 the impedance match 120 and impedance match 120 is coupled via the RF transmission line 132 to a TCP coil 116.

The RF power supply of the RF generator RFGB generates an RF signal 144, such as a sinusoidal signal, and supplies the RF signal 144 via the RF cable 130 to the impedance match 120. For example, the processor 108 sends via a connection medium 148 a parameter level and a frequency level of the RF signal 144 to the RF generator RFGB. The connection medium 148 couples the processor 108 to the RF generator RFGB. Upon receiving the parameter level and the frequency level from the processor 108, the RF generator RFGB generates the RF signal 144 having the parameter level and the frequency level. An example of a connection medium, as used herein, is a conductor or a group of conductors. To illustrate, a connection medium is a serial transfer cable, a parallel transfer cable, or a Universal Serial Bus (USB) cable.

The RF signal 144 is a continuous wave signal. For example, the RF signal 144 is not pulsed from one state to another. As another example, all power magnitudes of the parameter level of the RF signal 144 are within a predefined range, such as 18%, 19%, or 20%. To illustrate, a lowest parameter magnitude of the parameter level of the RF signal 144 is 20% lower than a highest parameter magnitude of the parameter level of the RF signal 144. As yet another example, the RF signal 144 has a single parameter level.

The impedance match 120 matches an impedance of a load, such as the RF transmission line 132 and the plasma chamber 112, coupled to an output of impedance match 120 which an impedance of a source, such as the RF cable 130 and the RF generator RFGB, coupled to an input of the impedance match 120 to generate a modified RF signal 146. The modified RF signal 146 is generated from the RF signal 144 received via the RF cable 130. The modified RF signal output from the impedance match 120 is supplied via the RF transmission line 132 to the TCP coil 116.

Moreover, the processor 108 generates a digital pulse signal 136, such as a clock signal, and provides the digital pulse signal 136 to the digital signal processor DSPA. Moreover, the processor 108 generates another digital pulse signal 138 and provides the digital pulse signal 138 to the digital signal processor DSPA. The digital pulse signal 136 is supplied via a connection medium 142 the digital signal processor DSPA. Similarly, the digital pulse signal 138 is supplied via another connection medium 142 to the digital signal processor DSPA. The connection medium 140 couples the processor 108 to the digital signal processor DSPA and the connection medium 142 couples the processor 108 to the digital signal processor DSPA.

Upon receiving the digital pulse signal 136, the digital signal processor DSPA identifies an occurrence of a state of the digital pulse signal 136. For example, the digital signal processor DSPA determines whether a logic level of the digital pulse signal 136 is greater or lower than a predetermined threshold. Upon determining that the logic level of the digital pulse signal 136 is greater than the predetermined threshold, the digital signal processor DSPA identifies an occurrence of the state of the digital pulse signal 136 to be S1. On the other hand, upon determining that the logic level of the digital pulse signal 136 is less than the predetermined threshold, the digital signal processor DSPA identifies an occurrence of the state of the digital pulse signal 136 to be S0. As another example, the digital signal processor DSPA determines whether the logic level of the digital pulse signal 136 is zero or one. Upon determining that the logic level of the digital pulse signal 136 is one, the digital signal processor DSPA identifies the occurrence of the state of the digital pulse signal 136 to be S1. On the other hand, upon determining that the logic level of the digital pulse signal 136 is zero, the digital signal processor DSPA identifies the occurrence of the state of the digital pulse signal 136 to be S0.

Similarly, upon receiving the digital pulse signal 138, the digital signal processor DSPA identifies an occurrence of a state of the digital pulse signal 138. For example, when the digital pulse signal 138 has five states, the digital signal processor DSPA determines whether a logic level of the digital pulse signal 138 is within a first predetermined range, a second predetermined range, a third predetermined range, a fourth predetermined range, or a fifth predetermined range. Upon determining that the logic level of the digital pulse signal 138 is within the first predetermined range, the digital signal processor DSPA identifies an occurrence of the state of the digital pulse signal 138 to be S1. Similarly, upon determining that the logic level of the digital pulse signal 138 is within the second predetermined range, the digital signal processor DSPA identifies an occurrence of the state of the digital pulse signal 138 to be S2. Moreover, upon determining that the logic level of the digital pulse signal 138 is within the third predetermined range, the digital signal processor DSPA identifies an occurrence of the state of the digital pulse signal 138 to be S3. Also, upon determining that the logic level of the digital pulse signal 138 is within the force predetermined range, the digital signal processor DSPA identifies an occurrence of the state of the digital pulse signal 138 to be S4. Upon determining that the logic level of the digital pulse signal 138 is within the fifth predetermined range, the digital signal processor DSPA identifies an occurrence of the state of the digital pulse signal 138 to be S5.

As another example, when the digital pulse signal 138 has five states, the digital signal processor DSPA determines whether the logic level of the digital pulse signal 138 is 1, 2, 3, 4, or 5. Upon determining that the logic level of the digital pulse signal 138 is one, the digital pulse signal DSPA identifies the occurrence of the state of the digital pulse signal 138 to be S1. Similarly, upon determining that the logic level of the digital pulse signal 138 is two, the digital pulse signal DSPA identifies the occurrence of the state of the digital pulse signal 138 to be S2. Also, upon determining that the logic level of the digital pulse signal 138 is three, the digital signal processor DSPA identifies the occurrence of the state of the digital pulse signal 138 to be S3. Moreover, upon determining that the logic level of the digital pulse signal 138 is four, the digital signal processor DSPA identifies the occurrence of the state of the digital pulse signal 138 to be S4. Upon determining that the logic level of the digital pulse signal 138 is five, the digital signal processor DSPA identifies the occurrence of the state of the digital pulse signal 138 to be S5.

In response to identifying the occurrence of the state of the digital pulse signal 136 to be S0, the digital signal processor DSPA sends a signal to the frequency controller FCS(m−M). Upon receiving the signal during the occurrence of the state S0 of the digital pulse signal 136, the frequency controller FCS(m−M) accesses a frequency level stored within the frequency controller FCS(m−M) and provides the frequency level to the driver system DRVRA. It should be noted that a frequency level is stored within a frequency controller, described herein, within a memory device of the frequency controller and the frequency level is accessed by a processor of the frequency controller from the memory device of the frequency controller. Examples of the frequency level stored within the frequency controller FCS(m−M) include a frequency level f1, which is further described below.

Similarly, in response to identifying the occurrence of the state of the digital pulse signal 136 to be S1, the digital signal processor DSPA sends a signal to the frequency controller FCS(m). Upon receiving the signal during the occurrence of the state S0 of the digital pulse signal 136, the frequency controller FCS(m) accesses a frequency level stored within the frequency controller FCS(m) and provides the frequency level to the driver system DRVRA. Examples of the frequency level stored within the frequency controller FCS(m) include a frequency level f2, which is further described below.

Moreover, in response to identifying the occurrence of the state of the digital pulse signal 138 to be S1, the digital signal processor DSPA sends a signal to the parameter controller PRAS(n−N). Upon receiving the signal during the occurrence of the state S1 of the digital pulse signal 138, the parameter controller PRAS(n−N) accesses a parameter level stored within the parameter controller PRAS(n−N) and provides the parameter level to the driver system DRVRA. Examples of the parameter level, for the state S1 of the digital pulse signal 138, stored within the parameter controller PRAS(n−N) include parameter levels PR1 (FIGS. 2A and 2B), PR11 (FIGS. 3A-3D), and PR111 (FIGS. 4A and 4B), which are further described below.

Similarly, in response to identifying the occurrence of the state of the digital pulse signal 138 to be S2, the digital signal processor DSPA sends a signal to the parameter controller PRAS(n−3). Upon receiving the signal during the occurrence of the state S2 of the digital pulse signal 138, the parameter controller PRAS(n−3) accesses a parameter level stored within the parameter controller PRAS(n−3) and provides the parameter level to the driver system DRVRA. Examples of the parameter level, for the state S2 of the digital pulse signal 138, stored within the parameter controller PRAS(n−3) include parameter levels PR2 (FIGS. 2A and 2B), PR21 (FIGS. 3A-3D), and PR211 (FIGS. 4A and 4B), which are further described below.

Also, in response to identifying the occurrence of the state of the digital pulse signal 138 to be S3, the digital signal processor DSPA sends a signal to the parameter controller PRAS(n−2). Upon receiving the signal during the occurrence of the state S3 of the digital pulse signal 138, the parameter controller PRAS(n−2) accesses a parameter level stored within the parameter controller PRAS(n−2) and provides the parameter level to the driver system DRVRA. Examples of the parameter level, for the state S3 of the digital pulse signal 138, stored within the parameter controller PRAS(n−2) include parameter levels PR3 (FIGS. 2A and 2B), PR31 (FIGS. 3A-3D), and PR311 (FIGS. 4A and 4B), which are further described below.

Furthermore, in response to identifying the occurrence of the state of the digital pulse signal 138 to be S4, the digital signal processor DSPA sends a signal to the parameter controller PRAS(n−1). Upon receiving the signal during the occurrence of the state S4 of the digital pulse signal 138, the parameter controller PRAS(n−1) accesses a parameter level stored within the parameter controller PRAS(n−1) and provides the parameter level to the driver system DRVRA. Examples of the parameter level, for the state S4 of the digital pulse signal 138, stored within the parameter controller PRAS(n−1) include parameter levels PR41 (FIGS. 3A-3D) and PR411 (FIGS. 4A and 4B), which are further described below.

In response to identifying the occurrence of the state of the digital pulse signal 138 to be S5, the digital signal processor DSPA sends a signal to the parameter controller PRAS(n). Upon receiving the signal during the occurrence of the state S5 of the digital pulse signal 138, the parameter controller PRAS(n) accesses a parameter level stored within the parameter controller PRAS(n) and provides the parameter level to the driver system DRVRA. An example of the parameter level stored, for the state S5 of the digital pulse signal 138, within the parameter controller PRAS(n) includes a parameter level PR511 (FIGS. 4A and 4B), which is further described below.

During the occurrence of the state S1 of the digital pulse signal 138, the driver system DRVRA generates a current signal based on the parameter level PR1, PR11, or PR111, and provides the current signal to the RF power supply 102. Also, the RF power supply 102 generates an RF signal 122 upon receiving the current signal from the driver system DRVRA during the occurrence of the state S1 of the digital pulse signal 138. The RF signal 122 has the parameter level PR1, PR11, or PR111 during the occurrence of the state S1 of the digital pulse signal 138.

Similarly, during the occurrence of the state S2 of the digital pulse signal 138, the driver system DRVRA generates the current signal based on the parameter level PR2, PR21, or PR211, and provides the current signal to the RF power supply 102. Also, the RF power supply 102 generates the RF signal 122 upon receiving the current signal from the driver system DRVRA during the occurrence of the state S2 of the digital pulse signal 138. The RF signal 122 has the parameter level PR2, PR21, or PR211 during the occurrence of the state S2 of the digital pulse signal 138.

Moreover, during the occurrence of the state S3 of the digital pulse signal 138, the driver system DRVRA generates the current signal based on the parameter level PR3, PR31, or PR311, and provides the current signal to the RF power supply 102. Also, the RF power supply 102 generates the RF signal 122 upon receiving the current signal from the driver system DRVRA during the occurrence of the state S3 of the digital pulse signal 138. The RF signal 122 has the parameter level PR3, PR31, or PR311 during the occurrence of the state S3 of the digital pulse signal 138.

Furthermore, during the occurrence of the state S4 of the digital pulse signal 138, the driver system DRVRA generates the current signal based on the parameter level PR41 or PR411, and provides the current signal to the RF power supply 102. Also, the RF power supply 102 generates the RF signal 122 upon receiving the current signal from the driver system DRVRA during the occurrence of the state S4 of the digital pulse signal 138. The RF signal 122 has the parameter level PR41 or PR411 during the occurrence of the state S4 of the digital pulse signal 138.

Moreover, during the occurrence of the state S5 of the digital pulse signal 138, the driver system DRVRA generates the current signal based on the parameter level PR511, and provides the current signal to the RF power supply 102. Also, the RF power supply 102 generates the RF signal 122 upon receiving the current signal from the driver system DRVRA during the occurrence of the state S5 of the digital pulse signal 138. The RF signal 122 has the parameter level PR511 during the occurrence of the state S5 of the digital pulse signal 138.

During the occurrence of the state S0 of the digital pulse signal 136, the driver system DRVRA generates the current signal based on the frequency level f0, and provides the current signal to the RF power supply 102. Also, the RF power supply 102 generates the RF signal 122 upon receiving the current signal from the driver system DRVRA during the occurrence of the state S0 of the digital pulse signal 136. The RF signal 122 has the frequency level f0 during the occurrence of the state S0 of the digital pulse signal 136.

Similarly, during the occurrence of the state S1 of the digital pulse signal 136, the driver system DRVRA generates the current signal based on the frequency level f1, and provides the current signal to the RF power supply 102. Also, the RF power supply 102 generates the RF signal 122 upon receiving the current signal from the driver system DRVRA during the occurrence of the state S1 of the digital pulse signal 136. The RF signal 122 has the frequency level f1 during the occurrence of the state S1 of the digital pulse signal 136.

The impedance match 104 receives the RF signal 122 via the RF cable 128 and matches an impedance of the load coupled to the output of the impedance match 104 with that of the source coupled to the input of the impedance match 104 to generate a modified RF signal 124. The modified RF signal 124 is supplied from the output of the impedance match 104 to the substrate support 114. For example, the modified RF signal 124 is supplied by the RF transmission line 126 to the lower electrode of the substrate support 114.

When one or more process gases are supplied to the plasma chamber 122 in addition to supplying the modified RF signal 146 and the modified RF signal 124, plasma is stricken or maintained within the plasma chamber 112 to process the substrate 118. Examples of the one or more process gases include an oxygen-containing gas, such as $O_2$. Other examples of the one or more process gases include a fluorine-containing gas, e.g., tetrafluoromethane ($CF_4$), sulfur hexafluoride ($SF_6$), hexafluoroethane ($C_2F_6$), etc. Examples of processing the substrate 119 includes depositing a material on the substrate 118, etching the substrate 118, cleaning the substrate 118, and sputtering the substrate 118.

In some embodiments, an impedance match, as described herein is referred to as an impedance matching circuit or an impedance matching network.

In various embodiments, any number of TCP coils, such as two or three or four, located over the dielectric window 134. In some embodiments, one or more TCP coils are located next to a sidewall of the plasma chamber 112.

In several embodiments, instead of the plasma chamber 112 being a TCP plasma chamber, a capacitively coupled plasma (CCP) chamber is used. The CCP chamber includes an upper electrode, such as a capacitive plate, and the chuck. The chuck faces the upper electrode. The upper electrode is coupled to the RF transmission line 132. The upper electrode is made of a metal, such as aluminum or an alloy of aluminum.

In some embodiments, the parameter controllers PRAS(n–N) through PRAS(n), the frequency controllers FCS(m–M) through FCS(m), and the digital signal processor DSPA are parts of a controller of the RF generator RFGA. For example, functions, described herein, as performed by the parameter controllers PRAS(n–N) through PRAS(n), the frequency controllers FCS(m–M) through FCS(m), and the digital signal processor DSPA are performed by the controller of the RF generator RFGA.

In various embodiments, instead of the processor 108, a clock source, such as a clock oscillator or an electronic oscillator, generates the digital pulse signal 136.

In several embodiments, the TCP coil 116 is considered to be a part of the plasma chamber 112.

In some embodiments, when the digital pulse signal 138 has three states S1 through S3 without the states S4 and S5, the digital signal processor DSPA identifies the three states to be S1, S2, and S3 in the same manner in which the digital pulse signal identifies the five states of the digital pulse signal 138 except that the digital signal processor DSPA does not identify the states S4 and S5. Moreover, in various embodiments, when the digital pulse signal 138 has four states S1 through S4 without the state S5, the digital signal processor DSPA identifies the four states to be S1, S2, S3, and S4 in the same manner in which the digital pulse signal identifies the five states of the digital pulse signal 138 except that the digital signal processor DSPA does not identify the state S5.

In various embodiments, when the digital pulse signal 138 has three states S1 through S3 without the states S4 and S5, in response to identifying the occurrence of the state of the digital pulse signal 138 to be S1, S2, or S3, the digital signal processor DSPA sends a signal to a corresponding one of the parameter controllers PRAS(n–N), PRAS(n–1), and PRAS(n). Upon receiving the signal during the occurrence of the state S1, S2, or S3 of the digital pulse signal 138, the corresponding parameter controller PRAS(n–N), PRAS(n–1), or PRAS(n) accesses a parameter level stored within the parameter controller and provides the parameter level to the driver system DRVRA. In some embodiments, when the digital pulse signal 138 has four states S1 through S4 without the state S5, in response to identifying the occurrence of the state of the digital pulse signal 138 to be S1, S2, S3, or S4, the digital signal processor DSPA sends a signal to a corresponding one of the parameter controllers PRAS (n–N), PRAS(n–2), PRAS(n–1), and PRAS(n). Upon receiving the signal during the occurrence of the state S1, S2, S3, or S4 of the digital pulse signal 138, the corresponding parameter controller PRAS(n–N), PRAS(n–2), PRAS (n–1), and PRAS(n) accesses a parameter level stored within the parameter controller and provides the parameter level to the driver system DRVRA.

In various embodiments, when the digital pulse signal 138 has three states S1 through S3 without the states S4 and S5, during the occurrence of one of the three states S1 through S3 of the digital pulse signal 138, the driver system DRVRA generates a current signal based on a corresponding one of the parameter levels PR1, PR2, and PR3, and provides the current signal to the RF power supply 102. Also, during the occurrence of the one of the three states S1 through S3 of the digital pulse signal 138, the RF power supply 102 generates the RF signal 122 upon receiving the current signal from the driver system DRVRA during the occurrence of the one of the three states S1 through S3 of the digital pulse signal 138. The RF signal 122 has the corresponding one of the parameter levels PR1, PR2, and PR3 during the occurrence of the one of the three states S1 through S3 of the digital pulse signal 138.

In some embodiments, when the digital pulse signal 138 has four states S1 through S4 without the state S5, during the occurrence of one of the four states S1 through S4 of the digital pulse signal 138, the driver system DRVRA generates a current signal based on a corresponding one of the parameter levels PR11, PR21, PR31, and PR41, and provides the current signal to the RF power supply 102. Also, during the occurrence of the one of the four states S1 through S4 of the digital pulse signal 138, the RF power supply 102 generates the RF signal 122 upon receiving the current signal from the driver system DRVRA during the occurrence of the one of the four states S1 through S4 of the digital pulse signal 138. The RF signal 122 has the corresponding one of the parameter levels PR11, PR21, PR31, and PR41 during the occurrence of the one of the four states S1 through S4 of the digital pulse signal 138.

In some embodiments, the RF generator RFGA is coupled via the RF cable 128, the impedance match 104, and the RF transmission line 126 to the TCP coil 116 instead of to the substrate support 114. Moreover, the RF generator RFGB is coupled via the RF cable 148, the impedance match 120, and the RF transmission line 132 to the substrate support 114 instead of to the TCP coil 116. For example, the modified RF signal 124 is supplied to the TCP coil 116 instead of the substrate support 114. Moreover, the modified RF signal 146 is supplied to the substrate support 114 instead of the TCP coil 116.

In various embodiments, the TCP coil is coupled to a ground potential instead of to the RF generator RFGB.

In some embodiments, the RF generator RFGA is coupled to the TCP coil 116 and the substrate support 114 is coupled to the ground potential.

In several embodiments, a combination of the digital signal processor DSPA, the parameter controllers PRAS(n–N) through PRAS(n), and the frequency controllers FCS(n–N) through FCS(n) are sometimes referred to herein as a controller. For example, each of the digital signal processor DSPA, the parameter controller PRAS(n–N), the parameter controller PRAS(n–1), the parameter controller PRAS(n), the frequency controller FCS(n–N), and the frequency controller FCS(n) is a portion, such as a hardware circuit or a software module, of the controller.

In various embodiments, any parameter levels, described herein, of the RF signal 122 are provided from the processor 108 via the connection medium 142 or another connection medium to the digital signal processor DSPA. In some embodiments, any frequency levels, described herein, of the RF signal 122 are provided from the processor 108 via the connection medium 140 or another connection medium to the digital signal processor DSPA. The parameter levels and the frequency levels, described herein, of the RF signal 122 are stored in the memory device 110.

FIG. 2A shows embodiments of graphs 202, 206, 210, and 214 to illustrate three-level pulsing of the parameter of the RF signal 122 (FIG. 1) generated by the RF generator RFGA (FIG. 1) and two-level pulsing of the frequency of the RF signal 122. The graph 202 plots a logic level of a digital pulse signal 204 versus time t. The digital pulse signal 204 is an example of the digital pulse signal 138 of FIG. 1.

During the state S1, the graph 202 has the logic level of one. Also, during the state S2, the graph 202 has the logic level of two. Moreover, during the state S3, the graph 202 has the logic level of three. For example, during a time period between 0 and t12, the logic level of the digital pulse signal 204 is one, during a time period between t12 and t22, the logic level of the digital pulse signal 204 is two, and during the time period between t22 and t32, the logic level of the digital pulse signal 204 is three.

The states S1 through S3 of the digital pulse signal 204 repeat periodically after the time t32. For example, during a time period between the times t32 and t42, the logic level of the digital pulse signal 204 is one, during a time period between the times t42 and t52, the logic level of the digital pulse signal 204 is two, and during the time period between the times t52 and t62, the logic level of the digital pulse signal 204 is three. As another example, during a time period between the times t62 and t72, the logic level of the digital pulse signal 204 is one, during a time period between the times t72 and t82, the logic level of the digital pulse signal 204 is two, and during the time period between the times t82 and t92, the logic level of the digital pulse signal 204 is three.

It should be noted that a duty cycle of the digital pulse signal 204 during the state S1 is p %, where p is a positive real number less than 100. For example, p % ranges from and including 20% to 40%. Moreover, a duty cycle of the digital pulse signal 204 during the state S2 is q %, where q is a positive real number less than 100%. For example, q % ranges from and including 20% to 40%. Also, a duty cycle of the digital pulse signal 204 during the state S3 is (100−p−q) %. For example, the duty cycle of the digital pulse signal 204 during the state S3 ranges from and including 20% to 40%. It should be noted that the duty cycles for the states S1 through S3 of the digital pulse signal 204 add to 100%, which is one occurrence of a cycle of the digital pulse signal 204.

The graph 206 plots a logic level of a digital pulse signal 208, which is an example of the digital pulse signal 136 of FIG. 1, versus the time t. The digital pulse signal 208 has the logic level of zero during the state S0 and the logic level of one during the state S1. For example, the digital pulse signal 208 has the logic level of zero during a time period between zero and the time t12 and has the logic level of one during a time period between the time t12 and the time t32.

The digital pulse signal 208 repeats the states S0 and S1 after the time t32. For example, the digital pulse signal 208 has the logic level of zero during a time period between t32 and the time t42, has the logic level of one during a time period between the time t42 and the time t62, has the logic level of zero during a time period between t62 and the time t72, and has the logic level of one during a time period between the time t72 and the time t92.

The graph 210 plots the parameter levels PR1, PR2, and PR3 of a parameter 212 of the RF signal 122 of FIG. 1 versus the time t. The parameter 212 is concurrent with, such as substantially synchronized with, the digital pulse signal 204. For example, the parameter 212 has the state S1 during the time period between the times 0 and t12, the state S2 during the time period between the times t12 and t22, and the state S3 during the time period between the times t22 and t32. To illustrate, the parameter 212 has the parameter level PR1 during the time period between the times 0 and t12, the parameter level PR2 during the time period between the times t12 and t22, and the parameter level PR3 during the time period between the times t22 and t32.

As another illustration, the parameter 212 transitions from the parameter level PR1 to the parameter level PR2 at approximately the same time, such as at the time t12 or within a pre-defined time period from the time t12, at which the digital pulse signal 204 transitions from the logic level 1 to the logic level 2. As yet another illustration, the parameter 212 transitions from the parameter level PR2 to the parameter level PR3 at approximately the same time, such as at the time t22 or within the pre-defined time period from the time t22, at which the digital pulse signal 204 transitions from the logic level 2 to the logic level 3. As another illustration, the parameter 212 transitions from the parameter level PR3 to the parameter level PR1 at approximately the same time, such as at the time t32 or within the pre-defined time period from the time t32, at which the digital pulse signal 204 transitions from the logic level 3 to the logic level 1. An example of the pre-defined time period, as used herein, from a time is a time period that is within 0-10% from the time. For example, the pre-defined time period from the time t32 is within 1-10% from the time t32. As another example, the pre-defined time period from the time t12 is within 1-10% from the time t12.

As another example, the parameter levels PR1 through PR3 repeat periodically after the time t32. To illustrate, the parameter 212 has the state S1 during the time period between the times t32 and t42, the state S2 during the time period between the times t42 and t52, and the state S3 during the time period between the times t52 and t62. As another illustration, the parameter 212 has the state S1 during the time period between the times t62 and t72, the state S2 during the time period between the times t72 and t82, and the state S3 during the time period between the times t82 and t92. As another illustration, the parameter 212 transitions from the parameter level PR1 to the parameter level PR2 at approximately the same time, such as at the time t42 or within the pre-defined time period from the time t42, at which the digital pulse signal 204 transitions from the logic level 1 to the logic level 2. As yet another illustration, the parameter 212 transitions from the parameter level PR2 to the parameter level PR3 at approximately the same time, such as at the time t52 or within the pre-defined time period from the time t52, at which the digital pulse signal 204 transitions from the logic level 2 to the logic level 3. As another illustration, the parameter 212 transitions from the parameter level PR3 to the parameter level PR1 at approximately the same time, such as at the time t62 or within the pre-defined time period from the time t62, at which the digital pulse signal 204 transitions from the logic level 3 to the logic level 1.

There is a stepwise increase from the parameter level PR1 to the parameter level PR3. For example, the parameter level PR2 is greater than the parameter level PR1 and the parameter level PR3 is greater than the parameter level PR2.

An example of the parameter level PR1 is a1 % of a maximum amount of bias voltage that is supplied to the substrate support 114 of FIG. 1. An example of a1 % ranges from and including 0% to 35%. Similarly, an example of the parameter level PR2 is b1% of the maximum amount of the bias voltage that is supplied to the substrate support 114. An example of b1% ranges from and including 35% to 70%. Also, an example of the parameter level PR3 is c1 % of the maximum amount of the bias voltage that is supplied to the substrate support 114. An example of c1 % ranges from and including 70% to 100% of the maximum amount of the bias voltage that is supplied to the substrate support 114. Another example of the parameter level PR3 ranges from and including 5 volts to 2 kilovolts (kV). As an example, the maximum amount of bias voltage is supplied to the substrate support 114 when the RF generator RFGA generates the RF signal 122 having a maximum magnitude of the parameter. In this example, the RF generator RFGA is not capable of generating a magnitude greater than the maximum magnitude of the parameter.

It should be noted that a difference between any two consecutive ones of the parameter levels PR1, PR2, and PR3 ranges from and including 15% to 35%. For example, the parameter level PR2 is at least 20% greater than the parameter level PR1 and the parameter level PR3 is at least 20% greater than the parameter level PR2. As another example, a parameter level increase from the parameter level PR1 to the parameter level PR2 or from the parameter level PR2 to the parameter level PR3 ranges from and including 30% to 35%. The parameter level PR2 is consecutive to the parameter level PRE Similarly, the parameter level PR3 is consecutive to the parameter level PR2.

The graph 214 plots the frequency levels f1 and f2 of a frequency 216 of the RF signal 122 versus the time t. The frequency level f1 ranges between 0.8 megahertz and 2 megahertz. For example, the frequency level f1 is 1 megahertz. The frequency level f2 ranges between 10 and 14 megahertz. For example, the frequency level f2 ranges from and including 10 megahertz to 13.5 megahertz.

The frequency 216 is concurrent with, such as substantially synchronized with, the digital pulse signal 208. For example, the frequency 216 is at the frequency level f1 during the state S0 and at the frequency level f2 during the state S1. To illustrate, the frequency 216 is at the frequency level f1 during a time period between the time 0 and the time t12 and is at the frequency level f2 for a time period between the time t12 and the time t32. As another illustration, the frequency 216 transitions from the frequency level f1 to the frequency level f2 at approximately the same time, such as at the time t12 or within the pre-defined time period from the time t12, at which the digital pulse signal 208 transitions from the logic level 0 to the logic level 1. As yet another illustration, the frequency 216 transitions from the frequency level f2 to the frequency level f1 at approximately the same time, such as at the time t32 or within the pre-defined time period from the time t32, at which the digital pulse signal 208 transitions from the logic level 1 to the logic level 0.

As another example, the frequency levels f1 and f2 repeat periodically after the time t32. To illustrate, the frequency 216 is at the frequency level f1 during a time period between the time t32 and the time t42 and is at the frequency level f2 for a time period between the time t42 and the time t62. As another illustration, the frequency 216 is at the frequency level f1 during a time period between the time t62 and the time t72 and is at the frequency level f2 for a time period between the time t72 and the time t92. As another illustration, the frequency 216 transitions from the frequency level f1 to the frequency level f2 at approximately the same time, such as at the time t42 or within the pre-defined time period from the time t42, at which the digital pulse signal 208 transitions from the logic level 0 to the logic level 1. As yet another illustration, the frequency 216 transitions from the frequency level f2 to the frequency level f1 at approximately the same time, such as at the time t62 or within the pre-defined time period from the time t62, at which the digital pulse signal 208 transitions from the logic level 1 to the logic level 0.

A difference between the frequency levels f1 and f2 is greater than a preset range. As an example, the frequency level f2 is greater than the frequency level f1 by at least 20%. To illustrate, an example of the frequency level f1 ranges from including 400 kHz to 2 MHz and an example of the frequency level f2 ranges from and including 10 MHz to 13 MHz.

When the parameter 212 is pulsed to be at a low level simultaneous with pulsing the frequency 216 at a low level and the parameter 212 is pulsed to be at a high level simultaneous with pulsing the frequency 216 at a high level, there is a decrease in an angular spread of ions of plasma within the plasma chamber 112 of FIG. 1. The decrease in the angular spread increases rate of processing, such as etching, the substrate 118 of FIG. 1. An example of the low level of the frequency 216 is the frequency level f1 and a high level of the frequency 216 is the frequency level f1. An example of the low level of the parameter 212 is the parameter level PR1 and of the high level of the parameter 212 is the parameter level PR3.

In some embodiments, instead of pulsing of the frequency 216 between the frequency levels f1 and f2, the RF signal 122 has a constant frequency level. For example, a difference between any two values of the constant frequency level is less than the preset range. To illustrate, a highest of values of the constant frequency level is at most 20% from a lowest of the values of the constant frequency level.

In various embodiments, a duty cycle of the frequency 216 is different than that illustrated in FIG. 2A. For example, instead of 66.66%, a duty cycle of the frequency 216 ranges from and including 20% to 80%.

Figure 2B:
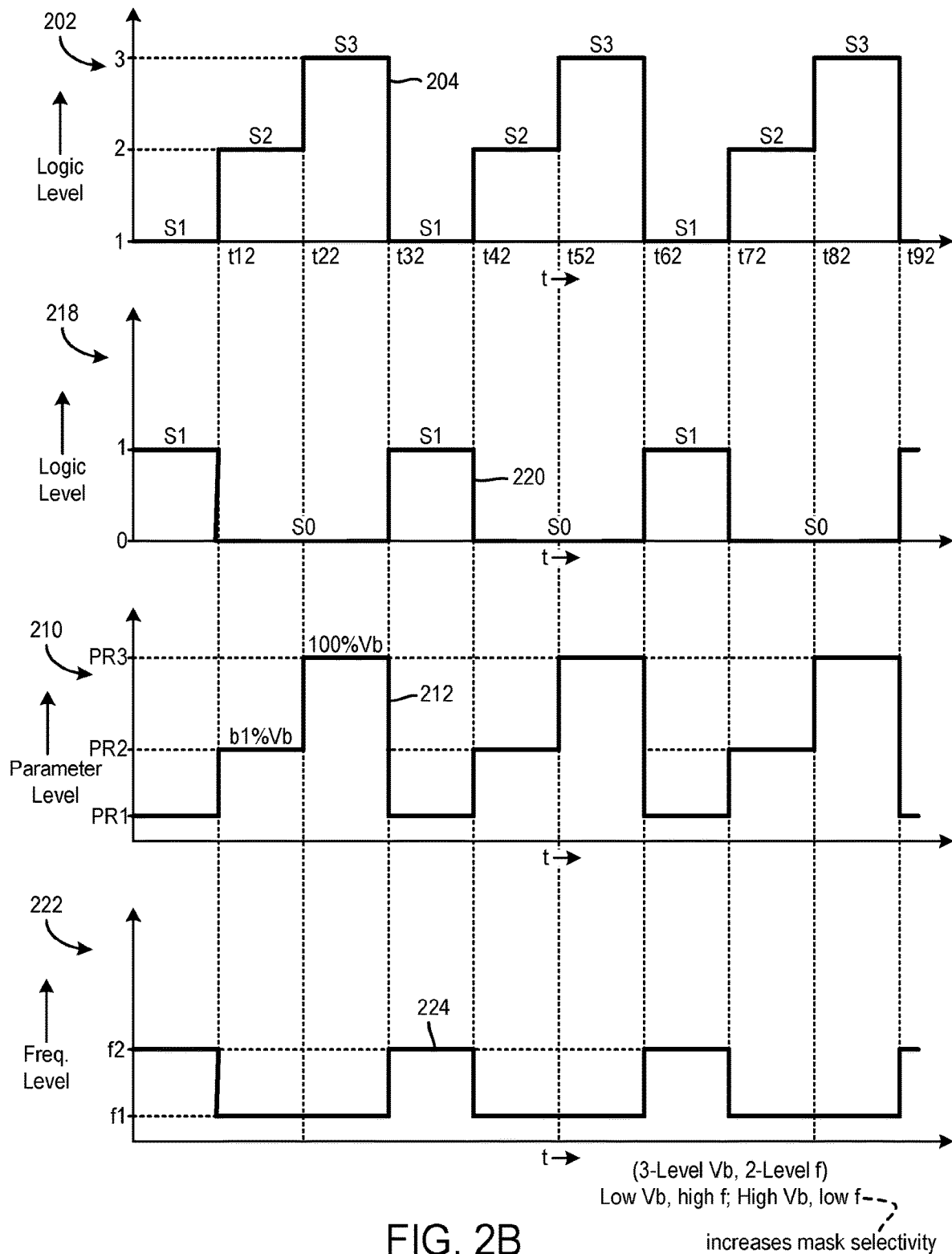
FIG. 2B shows embodiments of graphs to illustrate reverse two-level pulsing of the frequency of the RF signal compared to the three-level pulsing of the parameter of the RF signal.

FIG. 2B shows embodiments of the graphs 202 and 210, a graph 218, and a graph 222 to illustrate reverse pulsing of a frequency 224 of the RF signal 122 of FIG. 1 compared to pulsing of the parameter 212 of the RF signal 122.

The graph 218 plots a logic level of a digital pulse signal 220, which is an example of the digital pulse signal 136 of FIG. 1, versus the time t. The digital pulse signal 220 has the logic level of one during the state S1 and the logic level of zero during the state S0 and is reverse pulsed with respect to the digital pulse signal 208 of FIG. 2A. For example, the digital pulse signal 220 has the logic level of one during the time period between zero and the time t12 and has the logic level of zero during a time period between the time t12 and the time t32.

The digital pulse signal 220 repeats the states S0 and S1 after the time t32. For example, the digital pulse signal 220 has the logic level of one during the time period between t32 and the time t42, has the logic level of zero during the time period between the time t42 and the time t62, has the logic level of one during the time period between t62 and the time t72, and has the logic level of zero during the time period between the time t72 and the time t92.

The graph 222 plots the frequency 224 of the RF signal 122 versus the time t. The frequency 224 is concurrent with, such as substantially synchronized with, the digital pulse signal 220 and is reverse pulsed compared to the frequency 216 of FIG. 2A. For example, the frequency 224 has the state S1 during the time period between the times 0 and t12 and has the state S0 during the time period between the times t12 and t32. To illustrate, the frequency 224 has the frequency level f2 during the time period between the times 0 and t12 and has the frequency level f1 during the time period between the times t12 and t32. As another illustration, the frequency 224 transitions from the frequency level f2 to the frequency level f1 at approximately the same time, such as at the time t12 or within the pre-defined time period from the time t12, at which the digital pulse signal 220 transitions from the logic level 1 to the logic level 0. As yet another illustration, the frequency 224 transitions from the frequency level f1 to the frequency level f2 at approximately the same time, such as at the time t32 or within the pre-defined time period from the time t32, at which the digital pulse signal 220 transitions from the logic level 0 to the logic level 1.

The frequency 224 repeats the states S0 and S1 after the time t32. For example, the frequency 224 has the frequency level f2 during the time period between t32 and the time t42, has the frequency level f1 during the time period between the time t42 and the time t62, has the frequency level f2 during the time period between t62 and the time t72, and has the frequency level f1 during the time period between the time t72 and the time t92.

When the parameter 212 is pulsed at the low level, the frequency 224 is pulsed at the high level, such as the frequency level f2. To illustrate, during the time period between the times zero and t12, the parameter 212 is at the parameter level PR1 and the frequency 224 is at the frequency level f2. As another example, when the parameter 212 is pulsed at the high level, the frequency 224 is pulsed at the low level, such as the frequency level f1. To illustrate, during a time period between the times t22 and t32, the parameter 212 is at the parameter level PR3 and the frequency 224 is at the frequency level f1. It should be noted that pulsing of the parameter 212 to be at the high level simultaneous with pulsing of the frequency 224 to be at the low level and pulsing of the parameter 212 to be at the low level simultaneous with pulsing of the frequency 224 to be at the high level increases mask selectivity of the substrate 118. The mask selectivity, in some embodiments, is usually a ratio of an etch rate of etching a substrate layer of the substrate 118 below a mask layer of the substrate 118 and an etch rate of etching the mask layer. The mask layer is overlaid over the substrate layer of the substrate 118. The substrate layer 118 is overlaid on top of a silicon layer of the substrate 118. The mask layer allows patterns with very small features to be formed on the substrate layer. For example, the mask layer protects the substrate layer, such as a structured layer, that is located below the mask layer and above the silicon layer.

It should be noted that a time difference between the times t22 and t12 is the same as a time difference between t12 and 0. Similarly, a time difference between the times t32 and t22 is the same as the time difference between t22 and t12, and a time difference between the times t42 and t32 is the same as the time difference between the times t32 and t22. Also, a time difference between the times t52 and t42 is the same as the time difference between the times t42 and t32, and a time difference between the times t62 and t52 is the same as the time difference between the times t52 and t42. A time difference between the times t72 and t62 is the same as the time difference between t62 and t52, and a time difference between the times t82 and t72 is the same as the time difference between the times t72 and t62. A time difference between the times t92 and t82 is the same as the time difference between the times t82 and t72.

In various embodiments, a duty cycle of the frequency 224 is different than that illustrated in FIG. 2B. For example, instead of 33.33%, a duty cycle of the frequency 224 ranges from and including 20% to 80%.

Figure 3A:
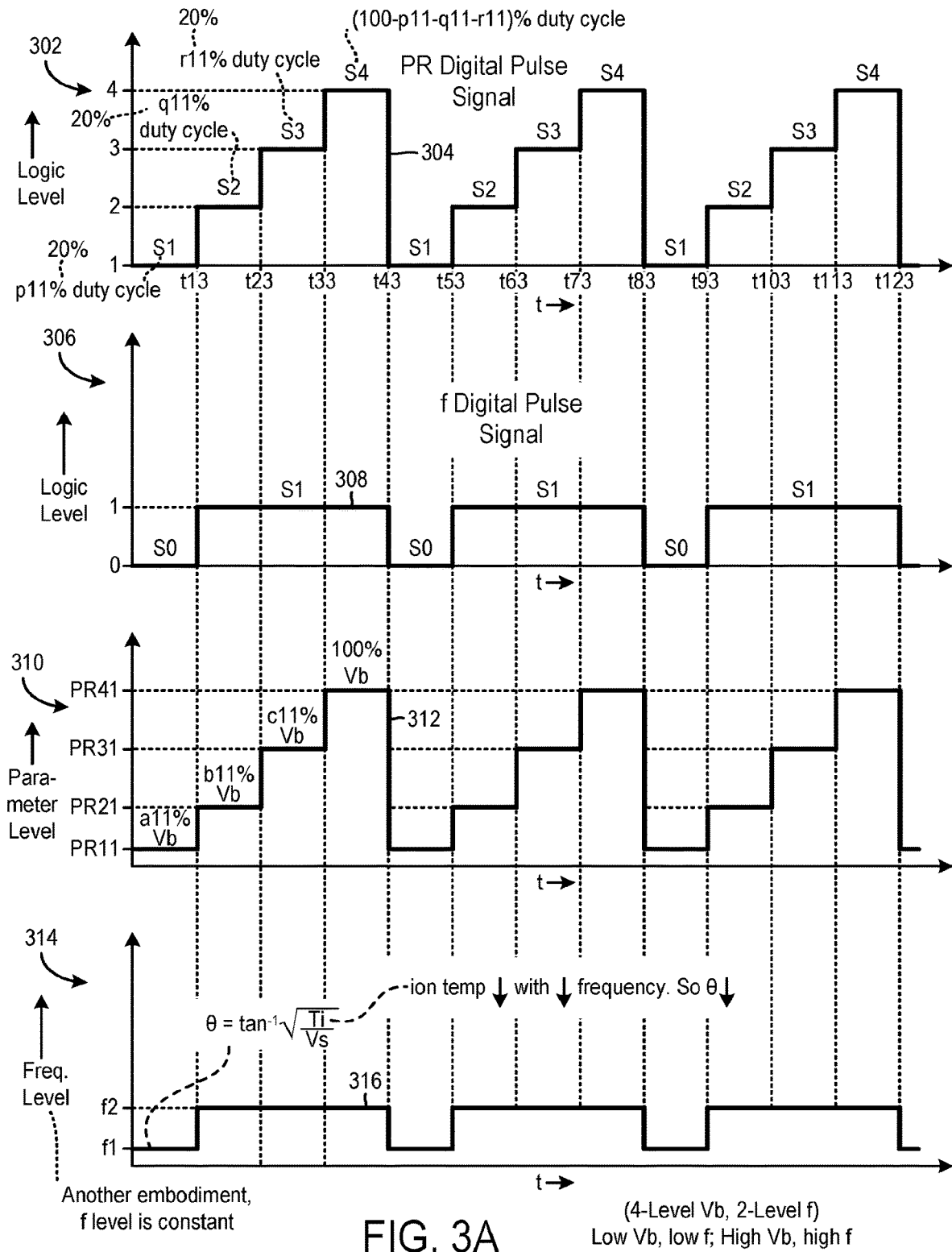
FIG. 3A shows embodiments of graphs to illustrate four-level pulsing of the parameter of the RF signal and two-level pulsing of the frequency of the RF signal.

FIG. 3A shows embodiments of graphs 302, 306, 310, and 314 to illustrate four-level pulsing of the parameter of the RF signal 122 (FIG. 1) generated by the RF generator RFGA (FIG. 1) and two-level pulsing of the frequency of the RF signal 122. The graph 302 plots a logic level of a digital pulse signal 304 versus the time t. The digital pulse signal 304 is an example of the digital pulse signal 138 of FIG. 1.

During the state S1, the graph 302 has the logic level of one. Also, during the state S2, the graph 302 has the logic level of two. Moreover, during the state S3, the graph 302 has the logic level of three. During the state S4, the graph 302 has a logic level of four. For example, during a time period between 0 and t13, the logic level of the digital pulse signal 304 is one, during a time period between t13 and t23, the logic level of the digital pulse signal 304 is two, during the time period between t23 and t33, the logic level of the digital pulse signal 304 is three, and during the time period between t33 and t43, the logic level of the digital pulse signal 304 is four.

The states S1 through S4 of the digital pulse signal 304 repeat periodically after the time t43. For example, during a time period between t43 and t53, the logic level of the digital pulse signal 304 is one, during a time period between t53 and t63, the logic level of the digital pulse signal 304 is two, during the time period between t63 and t73, the logic level of the digital pulse signal 304 is three, and during the time period between t73 and t83, the logic level of the digital pulse signal 304 is four. As another example, during a time period between t83 and t93, the logic level of the digital pulse signal 304 is one, during a time period between t93 and t103, the logic level of the digital pulse signal 304 is two, during the time period between t103 and t113, the logic level of the digital pulse signal 204 is three, and during the time period between t113 and t123, the logic level of the digital pulse signal 204 is four.

It should be noted that a duty cycle of the digital pulse signal 304 during the state S1 is p11%, where p11 is a positive real number less than 100. For example, p11% ranges from and including 15% to 35%. Moreover, a duty cycle of the digital pulse signal 304 during the state S2 is q11%, where q11 is a positive real number less than 100%. For example, q11% ranges from and including 15% to 35%. Also, a duty cycle of the digital pulse signal 304 during the state S3 is r11%. For example, r11% ranges from and including 15% to 35%. A duty cycle of the digital pulse signal 304 during the state S4 is (100−p11−q11−r11)%. It should be noted that the duty cycles for the states S1 through S4 of the digital pulse signal 304 add to 100%, which is one occurrence of a cycle of the digital pulse signal 304.

The graph 306 plots a logic level of a digital pulse signal 308, which is an example of the digital pulse signal 136 of FIG. 1, versus the time t. The digital pulse signal 308 has the logic level of zero during the state S0 and the logic level of one during the state S1. For example, the digital pulse signal 308 has the logic level of zero during a time period between zero and the time t13 and has the logic level of one during a time period between the time t13 and the time t43.

The digital pulse signal 308 repeats the states S0 and S1 after the time t43. For example, the digital pulse signal 308 has the logic level of zero during a time period between t43 and the time t53, has the logic level of one during a time period between the time t53 and the time t83, has the logic level of zero during a time period between t83 and the time t93, and has the logic level of one during a time period between the time t93 and the time t123.

The graph 310 plots the parameter levels PR11, PR21, PR31, and PR41 of a parameter 312 of the RF signal 122 of FIG. 1 versus the time t. The parameter 312 is concurrent with, such as substantially synchronized with, the digital pulse signal 304. For example, the parameter 312 has the state S1 during the time period between the times 0 and t13, the state S2 during the time period between the times t13 and t23, the state S3 during the time period between the times t23 and t33, and the state S4 during the time period between the times t33 and t43. To illustrate, the parameter 312 has the parameter level PR11 during the time period between the times 0 and t13, the parameter level PR21 during the time period between the times t13 and t23, the parameter level PR31 during the time period between the times t23 and t33, and the parameter level PR41 during the time period between the times t33 and t43.

As another illustration, the parameter 312 transitions from the parameter level PR11 to the parameter level PR21 at approximately the same time, such as at the time t13 or within the pre-defined time period from the time t13, at which the digital pulse signal 304 transitions from the logic level 1 to the logic level 2. As yet another illustration, the parameter 312 transitions from the parameter level PR21 to the parameter level PR31 at approximately the same time, such as at the time t23 or within the pre-defined time period from the time t23, at which the digital pulse signal 304 transitions from the logic level 2 to the logic level 3. As another illustration, the parameter 312 transitions from the parameter level PR31 to the parameter level PR41 at approximately the same time, such as at the time t33 or within the pre-defined time period from the time t33, at which the digital pulse signal 304 transitions from the logic level 3 to the logic level 4. As another illustration, the parameter 312 transitions from the parameter level PR41 to the parameter level PR11 at approximately the same time, such as at the time t43 or within the pre-defined time period from the time t43, at which the digital pulse signal 304 transitions from the logic level 4 to the logic level 1.

As another example, the parameter levels PR11 through PR41 repeat periodically after the time t43. To illustrate, the parameter 312 has the state S1 during the time period between the times t43 and t53, the state S2 during the time period between the times t53 and t63, the state S3 during the time period between the times t63 and t73, and the state S4 during the time period between the times t73 and t83. As another illustration, the parameter 312 has the state S1 during the time period between the times t83 and t93, the state S2 during the time period between the times t93 and t103, the state S3 during the time period between the times t103 and t113, and the state S4 during the time period between the times t113 and t123.

There is a stepwise increase from the parameter level PR11 to the parameter level PR41. For example, the parameter level PR21 is greater than the parameter level PR11, the parameter level PR31 is greater than the parameter level PR21, and the parameter level PR41 is greater than the parameter level PR31.

An example of the parameter level PR11 is a1 1% of the maximum amount of bias voltage that is supplied to the substrate support 114 of FIG. 1. An example of a1 1% ranges from and including 0% to 25% of the maximum value. An example of the parameter level PR21 is b1 1% of the maximum amount of the bias voltage that is supplied to the substrate support 114. An example of b1 1% ranges from and including 25% to 50% of the maximum value. Also, an example of the parameter level PR31 is c1 1 % of the maximum amount of the bias voltage that is supplied to the substrate support 114. An example of c1 1 % ranges from and including 50% to 75% of the maximum value. An example of the parameter level PR41 ranges from and including 5 volts to 2 kV. The parameter level PR41 ranges from and including 75% to 100% of the maximum value.

It should be noted that a difference between any two consecutive ones of the parameter levels PR11, PR21, PR31, and PR41 ranges from and including 15% to 30%. For example, the parameter level PR21 is at least 20% greater than the parameter level PR11, the parameter level PR31 is at least 20% greater than the parameter level PR21, and the parameter level PR41 is at least 20% greater than the parameter level PR31. As another example, a parameter level increase from the parameter level PR11 to the parameter level PR21 or from the parameter level PR21 to the parameter level PR31 or from the parameter level PR31 to the parameter level PR41 ranges from and including 20% to 30%. The parameter level PR21 is consecutive to the parameter level PR11. Similarly, the parameter level PR31 is consecutive to the parameter level PR21 and the parameter level PR41 is consecutive to the parameter level PR31.

The graph 314 plots the frequency levels f1 and f2 of a frequency 316 of the RF signal 122 versus the time t. The frequency 316 is concurrent with, such as substantially synchronized with, the digital pulse signal 308. For example, the frequency 316 is at the frequency level f1 during the state S0 and at the frequency level f2 during the state S1. To illustrate, the frequency 316 is at the frequency level f1 during a time period between the time zero and the time t13 and is at the frequency level f2 for a time period between the time t13 and the time t43. As another illustration, the frequency 316 transitions from the frequency level f1 to the frequency level f2 at approximately the same time, such as at the time t13 or within the pre-defined time period from the time t13, at which the digital pulse signal 308 transitions from the logic level 0 to the logic level 1. As yet another illustration, the frequency 316 transitions from the frequency level f2 to the frequency level f1 at approximately the same time, such as at the time t43 or within the pre-defined time period from the time t43, at which the digital pulse signal 308 transitions from the logic level 1 to the logic level 0.

As another example, the frequency levels f1 and f2 repeat periodically after the time t43. To illustrate, the frequency 316 is at the frequency level f1 during a time period between the time t43 and the time t53 and is at the frequency level f2 for a time period between the time t53 and the time t83. As another illustration, the frequency 316 is at the frequency level f1 during a time period between the time t83 and the time t93 and is at the frequency level f2 for a time period between the time t93 and the time t123. As another illustration, the frequency 316 transitions from the frequency level f1 to the frequency level f2 at the time t53 at which the digital pulse signal 308 transitions from the logic level 0 to the logic level 1. As yet another illustration, the frequency 316 transitions from the frequency level f2 to the frequency level f1 at the time t83 at which the digital pulse signal 308 transitions from the logic level 1 to the logic level 0.

When the parameter 312 is pulsed to be at a low level simultaneously with pulsing the frequency 316 at a low level and the parameter 312 is pulsed to be at a high level simultaneously with pulsing the frequency 316 at a high level, there is a decrease in the angular spread of ions of plasma within the plasma chamber 112 of FIG. 1. The decrease in the angular spread increases the rate of processing of the substrate 118 of FIG. 1. An example of the low level of the frequency 316 is the frequency level f1 and a high level of the frequency 316 is the frequency level f2. An example of the low level of the parameter 312 is the parameter level PR11 and of the high level of the parameter 312 is the parameter level PR41. Another example of the high level of the parameter 312 is the parameter level PR31.

It should further be noted that when the frequency 316 is at the low level, there is a decrease in temperature of ions of plasma within the plasma chamber 112. A relationship between the temperature of ions, voltage supplied to the ions, and of the angular spread is expressed as $$\theta = tan^{-1}\sqrt{\frac{Ti}{Vs}},$$

where θ is the angular spread, Ti is the temperature of ions, and Vs is a sheath voltage of plasma sheath of plasma within the plasma chamber 112.

In some embodiments, instead of pulsing of the frequency 316 between the frequency levels f1 and f2, the RF signal 122 has the constant frequency level.

In various embodiments, a duty cycle of the frequency 316 is different than that illustrated in FIG. 3A. For example, instead of 75%, a duty cycle of the frequency 316 ranges from and including 20% to 80%.

FIG. 3B shows embodiments of the graphs 302 and 310, a graph 318, and a graph 322 to illustrate reverse pulsing of a frequency 324 of the RF signal 122 of FIG. 1 compared to pulsing of the parameter 312 of the RF signal 122. The graph 318 plots a logic level of a digital pulse signal 320, which is an example of the digital pulse signal 136 of FIG. 1, versus the time t. The digital pulse signal 320 has the logic level of one during the state S1 and the logic level of zero during the state S0 and is reverse pulsed with respect to the digital pulse signal 308 of FIG. 3A. For example, the digital pulse signal 320 has the logic level of one during the time period between zero and the time t13 and has the logic level of zero during a time period between the time t13 and the time t43.

The digital pulse signal 320 repeats the states S0 and S1 after the time t43. For example, the digital pulse signal 320 has the logic level of one during the time period between t43 and the time t53, has the logic level of zero during the time period between the time t53 and the time t83, has the logic level of one during the time period between t83 and the time t93, and has the logic level of zero during the time period between the time t93 and the time t123.

The graph 322 plots the frequency 324 of the RF signal 122 versus the time t. The frequency 324 is concurrent with, such as substantially synchronized with, the digital pulse signal 320 and is reverse pulsed compared to the frequency 316 of FIG. 2A. For example, the frequency 324 has the state S1 during the time period between the times 0 and t13 and has the state S0 during the time period between the times t13 and t43. To illustrate, the frequency 324 has the frequency level f2 during the time period between the times 0 and t13 and has the frequency level f1 during the time period between the times t13 and t43. As another illustration, the frequency 324 transitions from the frequency level f2 to the frequency level f1 at approximately the same time, such as at the time t13 or within the pre-defined time period from the time t13, at which the digital pulse signal 320 transitions from the logic level 1 to the logic level 0. As yet another illustration, the frequency 324 transitions from the frequency level f1 to the frequency level f2 at approximately the same time, such as at the time t43 or within the pre-defined time period from the time t43, at which the digital pulse signal 320 transitions from the logic level 0 to the logic level 1.

The frequency 324 repeats the states S0 and S1 after the time t43. For example, the frequency 324 has the frequency level f2 during the time period between t43 and the time t53, has the frequency level f1 during the time period between the time t53 and the time t83, has the frequency level f2 during the time period between t83 and the time t93, and has the frequency level f1 during the time period between the time t93 and the time t123.

When the parameter 312 is pulsed at the low level, the frequency 324 is pulsed at the high level, such as the frequency level f2. To illustrate, during the time period between the times zero and t13, the parameter 312 is at the parameter level PR11 and the frequency 324 is at the frequency level f2. As another example, when the parameter 312 is pulsed at the high level, the frequency 324 is pulsed at the low level, such as the frequency level f1. To illustrate, during a time period between the times t33 and t43, the parameter 312 is at the parameter level PR41 and the frequency 324 is at the frequency level f1. As another illustration, during a time period between the times t23 and t33, the parameter 312 is at the parameter level PR31 and the frequency 324 is at the frequency level f1. It should be noted that pulsing of the parameter 312 to be at the high level simultaneous with pulsing of the frequency 324 to be at the low level and pulsing of the parameter 312 to be at the low level simultaneous with pulsing of the frequency 324 to be at the high level increases the mask selectivity.

It should be noted that a time difference between the times t23 and t13 is the same as a time difference between t13 and 0. Similarly, a time difference between the times t33 and t23 is the same as the time difference between t23 and t13, and a time difference between the times t43 and t33 is the same as the time difference between the times t33 and t23. Similarly, a time difference between the times t53 and t43 is the same as the time difference between the times t43 and t33, and a time difference between the times t63 and t53 is the same as the time difference between the times t53 and t43. A time difference between the times t73 and t63 is the same as the time difference between t63 and t53, and a time difference between the times t83 and t73 is the same as the time difference between the times t73 and t63. A time difference between the times t93 and t83 is the same as the time difference between t83 and t73, and a time difference between the times t103 and t93 is the same as the time difference between the times t93 and t83. Also, a time difference between the times t113 and t103 is the same as the time difference between t103 and t93, and a time difference between the times t123 and t113 is the same as the time difference between the times t113 and t103.

In various embodiments, a duty cycle of the frequency 324 is different than that illustrated in FIG. 3B. For example, instead of 25%, a duty cycle of the frequency 324 ranges from and including 20% to 80%.

FIG. 3C shows embodiments of the graphs 302 and 310, a graph 326, and a graph 330 to illustrate pulsing of a frequency 332 of the RF signal 122 of FIG. 1 and pulsing of the parameter 312 of the RF signal 122. The graph 326 plots a logic level of a digital pulse signal 328, which is an example of the digital pulse signal 136 of FIG. 1, versus the time t. The digital pulse signal 328 has the logic level of zero during the state S0 and the logic level of one during the state S1 and has a different duty cycle compared to that of the digital pulse signal 308 of FIG. 3A. For example, the digital pulse signal 328 has the logic level of zero during the time period between zero and the time t23 and has the logic level of one during the time period between the time t23 and the time t43. As another example, the digital pulse signal 328 has the duty cycle of 50% and the digital pulse signal 308 has the duty cycle of 75%.

The digital pulse signal 328 repeats the states S0 and S1 after the time t43. For example, the digital pulse signal 328 has the logic level of zero during the time period between t43 and the time t63, has the logic level of one during the time period between the time t63 and the time t83, has the logic level of zero during the time period between t83 and the time t103, and has the logic level of one during the time period between the time t103 and the time t123.

The graph 330 plots the frequency 332 of the RF signal 122 versus the time t. The frequency 332 is concurrent with, such as substantially synchronized with, the digital pulse signal 328. For example, the frequency 332 has the state S0 during the time period between the times 0 and t23 and has the state S1 during the time period between the times t23 and t43. To illustrate, the frequency 332 has the frequency level f1 during the time period between the times 0 and t23 and has the frequency level f2 during the time period between the times t23 and t43. As another illustration, the frequency 332 transitions from the frequency level f1 to the frequency level f2 at approximately the same time, such as at the time t23 or within the pre-defined time period from the time t23, at which the digital pulse signal 328 transitions from the logic level 0 to the logic level 1. As yet another illustration, the frequency 332 transitions from the frequency level f2 to the frequency level f1 at approximately the same time, such as at the time t43 or within the pre-defined time period from the time t43, at which the digital pulse signal 308 transitions from the logic level 1 to the logic level 0.

The frequency 332 repeats the states S0 and S1 after the time t43. For example, the frequency 332 has the frequency level f1 during the time period between t43 and the time t63, has the frequency level f2 during the time period between the time t63 and the time t83, has the frequency level f1 during the time period between t83 and the time t103, and has the frequency level f2 during the time period between the time t103 and the time t123.

When the parameter 328 is pulsed to be at a low level simultaneous with pulsing the frequency 332 at a low level and the parameter 328 is pulsed to be at a high level simultaneous with pulsing the frequency 332 at a high level, there is a decrease in the angular spread of ions of plasma within the plasma chamber 112 of FIG. 1. An example of the low level of the frequency 332 is the frequency level f1 and a high level of the frequency 332 is the frequency level f2. An example of the low level of the parameter 328 is the parameter level PR11 and of the high level of the parameter 328 is the parameter level PR41. Another example of the low level of the parameter 328 is the parameter level PR21 and of the high level of the parameter 328 is the parameter level PR31.

In various embodiments, a duty cycle of the frequency 332 is different than that illustrated in FIG. 3C. For example, instead of 50%, a duty cycle of the frequency 332 ranges from and including 20% to 80%.

Figure 3D:
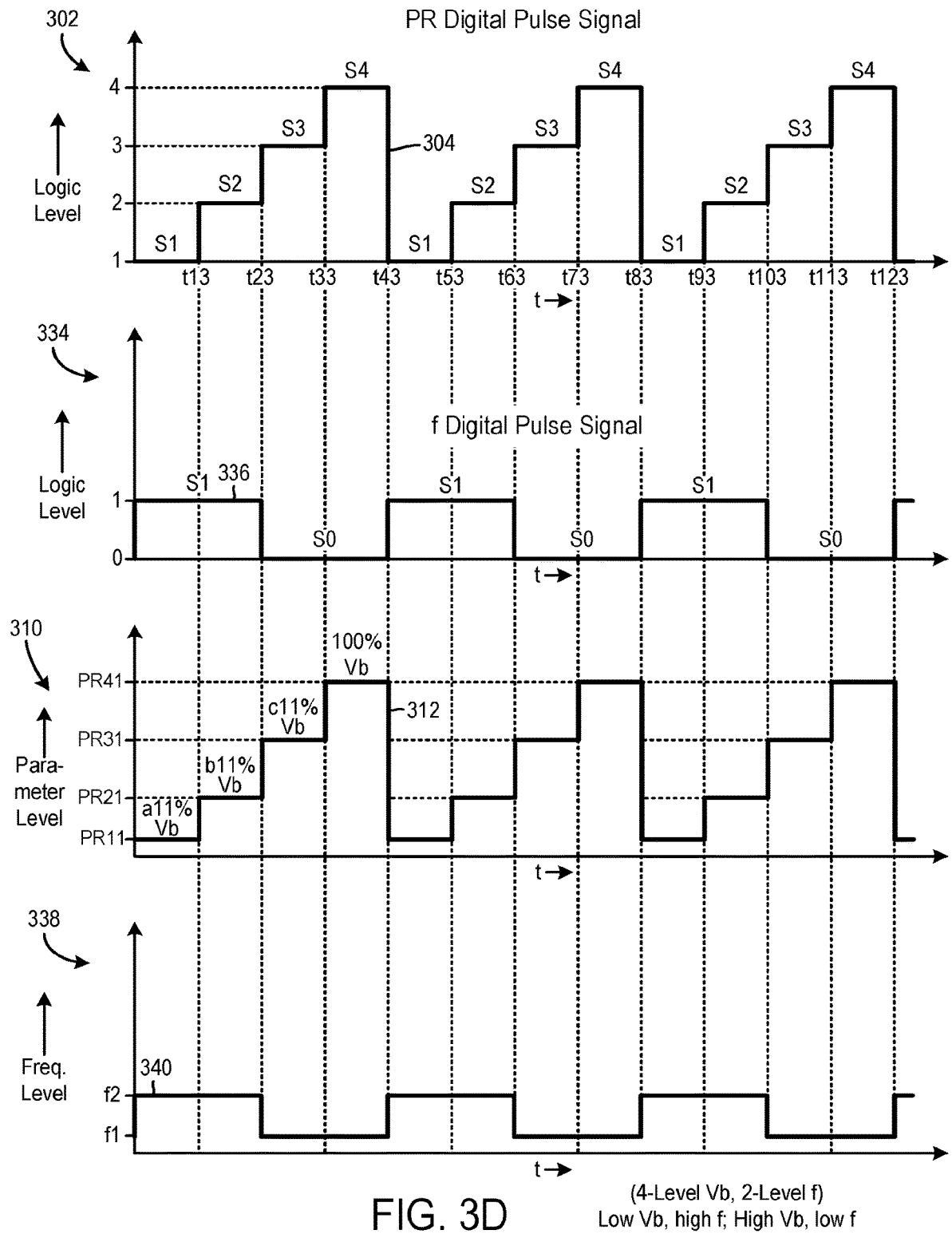
FIG. 3D shows embodiments of graphs to illustrate reverse two-level pulsing of the frequency of the RF signal compared to four-level pulsing of the parameter of the RF signal.

FIG. 3D shows embodiments of the graphs 302 and 310, a graph 334, and a graph 338 to illustrate reverse pulsing of a frequency 340 of the RF signal 122 of FIG. 1 compared to pulsing of the parameter 312 of the RF signal 122. The graph 334 plots a logic level of a digital pulse signal 336, which is an example of the digital pulse signal 136 of FIG. 1, versus the time t. The digital pulse signal 336 has the logic level of one during the state S1 and the logic level of zero during the state S0 and is reverse pulsed with respect to the digital pulse signal 328 of FIG. 3C. For example, the digital pulse signal 336 has the logic level of one during the time period between zero and the time t23 and has the logic level of zero during a time period between the time t23 and the time t43.

The digital pulse signal 336 repeats the states S0 and S1 after the time t43. For example, the digital pulse signal 336 has the logic level of one during the time period between t43 and the time t63, has the logic level of zero during the time period between the time t63 and the time t83, has the logic level of one during the time period between t83 and the time t103, and has the logic level of zero during the time period between the time t103 and the time t123.

The graph 338 plots the frequency 340 of the RF signal 122 versus the time t. The frequency 340 is concurrent with, such as substantially synchronized with, the digital pulse signal 336 and is reverse pulsed compared to the frequency 332 of FIG. 3C. For example, the frequency 340 has the state S1 during the time period between the times 0 and t23 and has the state S0 during the time period between the times t23 and t43. To illustrate, the frequency 340 has the frequency level f2 during the time period between the times 0 and t23 and has the frequency level f1 during the time period between the times t23 and t43. As another illustration, the frequency 340 transitions from the frequency level f2 to the frequency level f1 at approximately the same time, such as at the time t23 or within the pre-defined time period from the time t23, at which the digital pulse signal 336 transitions from the logic level 1 to the logic level 0. As yet another illustration, the frequency 340 transitions from the frequency level f1 to the frequency level f2 at approximately the same time, such as at the time t43 or within the pre-defined time period from the time t43, at which the digital pulse signal 336 transitions from the logic level 0 to the logic level 1.

The frequency 340 repeats the states S0 and S1 after the time t43. For example, the frequency 340 has the frequency level f2 during the time period between t43 and the time t63, has the frequency level f1 during the time period between the time t63 and the time t83, has the frequency level f2 during the time period between t83 and the time t103, and has the frequency level f1 during the time period between the time t103 and the time t123.

When the parameter 312 is pulsed at the low level, the frequency 340 is pulsed at the high level. To illustrate, during the time period between the times zero and t13, the parameter 312 is at the parameter level PR11 and the frequency 340 is at the frequency level f2. As another illustration, during the time period between the times t13 and t23, the parameter 312 is at the parameter level PR21 and the frequency 340 is at the frequency level f2. As another example, when the parameter 312 is pulsed at the high level, the frequency 340 is pulsed at the low level. To illustrate, during a time period between the times t33 and t43, the parameter 312 is at the parameter level PR41 and the frequency 340 is at the frequency level f1. As another illustration, during a time period between the times t23 and t33, the parameter 312 is at the parameter level PR31 and the frequency 340 is at the frequency level f1. It should be noted that pulsing of the parameter 312 to be at the high level simultaneous with pulsing of the frequency 340 to be at the low level and pulsing of the parameter 312 to be at the low level simultaneous with pulsing of the frequency 340 to be at the high level increases the mask selectivity.

In various embodiments, a duty cycle of the frequency 340 is different than that illustrated in FIG. 3D. For example, instead of 50%, a duty cycle of the frequency 340 ranges from and including 20% to 80%.

FIG. 4A shows embodiments of graphs 402, 406, 410, and 414 to illustrate five-level pulsing of the parameter of the RF signal 122 (FIG. 1) generated by the RF generator RFGA (FIG. 1) and two-level pulsing of the frequency of the RF signal 122. The graph 402 plots a logic level of a digital pulse signal 404 versus time t. The digital pulse signal 404 is an example of the digital pulse signal 138 of FIG. 1.

During the state S1, the graph 402 has the logic level of one. Also, during the state S2, the graph 402 has the logic level of two. Moreover, during the state S3, the graph 402 has the logic level of three. During the state S4, the graph 402 has a logic level of four. During the state S5, the graph 402 has a logic level of five. For example, during a time period between 0 and t14, the logic level of the digital pulse signal 404 is one, during a time period between t14 and t24, the logic level of the digital pulse signal 404 is two, during the time period between t24 and t34, the logic level of the digital pulse signal 404 is three, during the time period between t34 and t44, the logic level of the digital pulse signal 404 is four, and during the time period between t44 and t54, the logic level of the digital pulse signal 404 is five.

The states S1 through S5 of the digital pulse signal 404 repeat periodically after the time t54. For example, during a time period between t54 and t64, the logic level of the digital pulse signal 404 is one, during a time period between t64 and t74, the logic level of the digital pulse signal 404 is two, during the time period between t74 and t84, the logic level of the digital pulse signal 404 is three, during the time period between t84 and t94, the logic level of the digital pulse signal 404 is four, and during the time period between t94 and t104, the logic level of the digital pulse signal 404 is five.

It should be noted that a duty cycle of the digital pulse signal 404 during the state S1 is p111%, where p111 is a positive real number less than 100. For example, p111% ranges from and including 10% to 24%. Moreover, a duty cycle of the digital pulse signal 404 during the state S2 is q111%, where q111 is a positive real number less than 100%. For example, q111% ranges from and including 10% to 24%. Also, a duty cycle of the digital pulse signal 404 during the state S3 is r111%. For example, r111% ranges from and including 10% to 24%. A duty cycle of the digital pulse signal 404 during the state S4 is s111%. For example, s111% ranges from and including 10% to 24%. A duty cycle of the digital pulse signal 304 during the state S5 is (100−p111−q111−r111−s111)%. It should be noted that the duty cycles for the states S1 through S5 of the digital pulse signal 404 add to 100%, which is one occurrence of a cycle of the digital pulse signal 404.

The graph 406 plots a logic level of a digital pulse signal 408, which is an example of the digital pulse signal 136 of FIG. 1, versus the time t. The digital pulse signal 408 has the logic level of zero during the state S0 and the logic level of one during the state S1. For example, the digital pulse signal 408 has the logic level of zero during a time period between zero and the time t34 and has the logic level of one during a time period between the time t34 and the time t54.

The digital pulse signal 408 repeats the states S0 and S1 after the time t54. For example, the digital pulse signal 408 has the logic level of zero during a time period between t54 and the time t84 and has the logic level of one during a time period between the time t84 and the time t104.

The graph 410 plots the parameter levels PR111, PR211, PR311, PR411, and PR511 of a parameter 412 of the RF signal 122 of FIG. 1 versus the time t. The parameter 412 is concurrent with, such as substantially synchronized with, the digital pulse signal 404. For example, the parameter 412 has the state S1 during the time period between the times 0 and t14, the state S2 during the time period between the times t14 and t24, the state S3 during the time period between the times t24 and t34, the state S4 during the time period between the times t34 and t44, the state S5 during the time period between the times t44 and t54. To illustrate, the parameter 412 has the parameter level PR111 during the time period between the times 0 and t14, the parameter level PR211 during the time period between the times t14 and t24, the parameter level PR311 during the time period between the times t24 and t34, the parameter level PR411 during the time period between the times t34 and t44, and the parameter level PR511 during the time period between the times t44 and t54.

As another illustration, the parameter 412 transitions from the parameter level PR111 to the parameter level PR211 at approximately the same time, such as at the time t14 or within the pre-defined time period from the time t14, at which the digital pulse signal 404 transitions from the logic level 1 to the logic level 2. As yet another illustration, the parameter 412 transitions from the parameter level PR211 to the parameter level PR311 at approximately the same time, such as at the time t24 or within the pre-defined time period from the time t24, at which the digital pulse signal 404 transitions from the logic level 2 to the logic level 3. As another illustration, the parameter 412 transitions from the parameter level PR311 to the parameter level PR411 at approximately the same time, such as at the time t34 or within the pre-defined time period from the time t34, at which the digital pulse signal 404 transitions from the logic level 3 to the logic level 4. As yet another illustration, the parameter 412 transitions from the parameter level PR411 to the parameter level PR511 at approximately the same time, such as at the time t44 or within the pre-defined time period from the time t44, at which the digital pulse signal 404 transitions from the logic level 4 to the logic level 5. As another illustration, the parameter 412 transitions from the parameter level PR511 to the parameter level PR111 at approximately the same time, such as at the time t54 or within the pre-defined time period from the time t54, at which the digital pulse signal 404 transitions from the logic level 5 to the logic level 1.

As another example, the parameter levels PR111 through PR511 repeat periodically after the time t54. To illustrate, the parameter 412 has the state S1 during the time period between the times t54 and t64, the state S2 during the time period between the times t64 and t74, the state S3 during the time period between the times t74 and t84, the state S4 during the time period between the times t84 and t94, and the state S5 during the time period between the times t94 and t104. As another illustration, the parameter 412 transitions from the parameter level PR111 to the parameter level PR211 at approximately the same time, such as at the time t64 or within a pre-defined time period from the time t64, at which the digital pulse signal 404 transitions from the logic level 1 to the logic level 2. As yet another illustration, the parameter 412 transitions from the parameter level PR211 to the parameter level PR311 at approximately the same time, such as at the time t74 or within the pre-defined time period from the time t74, at which the digital pulse signal 404 transitions from the logic level 2 to the logic level 3. As another illustration, the parameter 412 transitions from the parameter level PR311 to the parameter level PR411 at approximately the same time, such as at the time t84 or within the pre-defined time period from the time t84, at which the digital pulse signal 404 transitions from the logic level 3 to the logic level 4. As yet another illustration, the parameter 412 transitions from the parameter level PR411 to the parameter level PR511 at approximately the same time, such as at the time t94 or within the pre-defined time period from the time t94, at which the digital pulse signal 404 transitions from the logic level 4 to the logic level 5. As another illustration, the parameter 412 transitions from the parameter level PR511 to the parameter level PR111 at approximately the same time, such as at the time t104 or within the pre-defined time period from the time t104, at which the digital pulse signal 404 transitions from the logic level 5 to the logic level 1.

There is a stepwise increase from the parameter level PR111 to the parameter level PR511. For example, the parameter level PR211 is greater than the parameter level PR111, the parameter level PR311 is greater than the parameter level PR211, the parameter level PR411 is greater than the parameter level PR311, and the parameter level PR511 is greater than the parameter level PR411.

An example of the parameter level PR111 is a111% of the maximum amount of bias voltage that is supplied to the substrate support 114 of FIG. 1. An example of a111% ranges from and including 0% to 20% of the maximum value. An example of the parameter level PR211 is b111% of the maximum amount of the bias voltage that is supplied to the substrate support 114. An example of b111% ranges from and including 20% to 40% of the maximum value. Also, an example of the parameter level PR311 is c111% of the maximum amount of the bias voltage that is supplied to the substrate support 114. An example of c111% ranges from and including 40% to 60% of the maximum value. An example of the parameter level PR411 is d111% of the maximum amount of the bias voltage that is supplied to the substrate support 114. An example of d111% ranges from and including 60% to 80% of the maximum value. An example of the parameter level PR511 ranges from and including 5 volts to 2 kV. The parameter level PR511 ranges from and including 80% to 100% of the maximum value of bias voltage that is supplied to the substrate support 114.

It should be noted that a difference between any two consecutive ones of the parameter levels PR111, PR211, PR311, PR411, and PR511 ranges from and including 15% to 25%. For example, the parameter level PR211 is at least 20% greater than the parameter level PR111, the parameter level PR311 is at least 20% greater than the parameter level PR211, the parameter level PR411 is at least 20% greater than the parameter level PR311, and the parameter level PR511 is at least 20% greater than the parameter level PR411. As another example, a parameter level increase from the parameter level PR111 to the parameter level PR211 or from the parameter level PR211 to the parameter level PR311 or from the parameter level PR311 to the parameter level PR411 or from the parameter level PR411 to the parameter level PR511 ranges from and including 15% to 25%. The increase in the parameter level facilitates a higher amount of peak energy of ions of plasma within the plasma chamber 112 and a narrow angular spread of the ions. The parameter level PR211 is consecutive to the parameter level PR111. Similarly, the parameter level PR311 is consecutive to the parameter level PR211, the parameter level PR411 is consecutive to the parameter level PR311, and the parameter level PR511 is consecutive to the parameter level PR411.

The graph 414 plots the frequency levels f1 and f2 of a frequency 416 of the RF signal 122 versus the time t. The frequency 416 is concurrent with, such as substantially synchronized with, the digital pulse signal 408. For example, the frequency 416 is at the frequency level f1 during the state S0 and at the frequency level f2 during the state S1. To illustrate, the frequency 416 is at the frequency level f1 during a time period between the time zero and the time t34 and is at the frequency level f2 for a time period between the time t34 and the time t54. As another illustration, the frequency 416 transitions from the frequency level f1 to the frequency level f2 at approximately the same time, such as at the time t34 or within the pre-defined time period from the time t34, at which the digital pulse signal 408 transitions from the logic level 0 to the logic level 1. As yet another illustration, the frequency 416 transitions from the frequency level f2 to the frequency level f1 at approximately the same time, such as at the time t54 or within the pre-defined time period from the time t54, at which the digital pulse signal 408 transitions from the logic level 1 to the logic level 0. As another example, the frequency levels f1 and f2 repeat periodically after the time t54. To illustrate, the frequency 416 is at the frequency level f1 during a time period between the time t54 and the time t84 and is at the frequency level f2 for a time period between the time t84 and the time t104.

When the parameter 412 is pulsed to be at a low level simultaneous with pulsing the frequency 416 at a low level and the parameter 412 is pulsed to be at a high level simultaneous with pulsing the frequency 416 at a high level, there is a decrease in the angular spread of ions of plasma within the plasma chamber 112 of FIG. 1. An example of the low level of the frequency 416 is the frequency level f1 and a high level of the frequency 416 is the frequency level f2. An example of the low level of the parameter 412 is the parameter level PR111 and of the high level of the parameter 412 is the parameter level PR511. Another example of the low level of the parameter 412 is the parameter level PR211 and of the high level of the parameter 412 is the parameter level PR411. It should be noted that when the frequency 416 is at the low level, there is a decrease in temperature of ions of plasma within the plasma chamber 112.

In some embodiments, instead of pulsing of the frequency 416 between the frequency levels f1 and f2, the RF signal 122 has the constant frequency level.

In various embodiments, a duty cycle of the frequency 416 is different than that illustrated in FIG. 4A. For example, instead of 40%, a duty cycle of the frequency 416 ranges from and including 20% to 80%.

FIG. 4B shows embodiments of the graphs 402 and 410, a graph 418, and a graph 422 to illustrate reverse pulsing of a frequency 424 of the RF signal 122 of FIG. 1 compared to pulsing of the parameter 412 of the RF signal 122.

The graph 418 plots a logic level of a digital pulse signal 420, which is an example of the digital pulse signal 136 of FIG. 1, versus the time t. The digital pulse signal 420 has the logic level of one during the state S1 and the logic level of zero during the state S0 and is reverse pulsed with respect to the digital pulse signal 408 of FIG. 4A. For example, the digital pulse signal 420 has the logic level of one during the time period between zero and the time t34 and has the logic level of zero during a time period between the time t34 and the time t54.

The digital pulse signal 420 repeats the states S0 and S1 after the time t54. For example, the digital pulse signal 420 has the logic level of one during the time period between t54 and the time t84 and has the logic level of zero during the time period between the time t84 and the time t104.

The graph 422 plots the frequency 424 of the RF signal 122 versus the time t. The frequency 424 is concurrent with, such as substantially synchronized with, the digital pulse signal 420 and is reverse pulsed compared to the frequency 416 of FIG. 4A. For example, the frequency 424 has the state S1 during the time period between the times 0 and t34 and has the state S0 during the time period between the times t34 and t54. To illustrate, the frequency 424 has the frequency level f2 during the time period between the times 0 and t34 and has the frequency level f1 during the time period between the times t34 and t54. As another illustration, the frequency 424 transitions from the frequency level f2 to the frequency level f1 at approximately the same time, such as at the time t34 or within the pre-defined time period from the time t34, at which the digital pulse signal 420 transitions from the logic level 1 to the logic level 0. As yet another illustration, the frequency 424 transitions from the frequency level f1 to the frequency level f2 at approximately the same time, such as at the time t54 or within the pre-defined time period from the time t54, at which the digital pulse signal 420 transitions from the logic level 0 to the logic level 1.

The frequency 424 repeats the states S0 and S1 after the time t54. For example, the frequency 424 has the frequency level f2 during the time period between t54 and the time t84 and has the frequency level f1 during the time period between the time t84 and the time t104.

When the parameter 412 is pulsed at the low level, the frequency 424 is pulsed at the high level, such as the frequency level f2. To illustrate, during the time period between the times zero and t14, the parameter 412 is at the parameter level PR11 and the frequency 424 is at the frequency level f2. As another illustration, during the time period between the times t14 and t24, the parameter 412 is at the parameter level PR21 and the frequency 424 is at the frequency level f2. As another example, when the parameter 412 is pulsed at the high level, the frequency 424 is pulsed at the low level, such as the frequency level f1. To illustrate, during a time period between the times t44 and t54, the parameter 412 is at the parameter level PR511 and the frequency 424 is at the frequency level f1. As another illustration, during a time period between the times t34 and t44, the parameter 412 is at the parameter level PR411 and the frequency 424 is at the frequency level f1. It should be noted that pulsing of the parameter 412 to be at the high level simultaneous with pulsing of the frequency 424 to be at the low level and pulsing of the parameter 412 to be at the low level simultaneous with pulsing of the frequency 424 to be at the high level increases the mask selectivity.

It should be noted that a time difference between the times t24 and t14 is the same as a time difference between t14 and 0. Similarly, a time difference between the times t34 and t24 is the same as the time difference between t24 and t14, and a time difference between the times t44 and t34 is the same as the time difference between the times t34 and t24. Similarly, a time difference between the times t54 and t44 is the same as the time difference between the times t44 and t34, and a time difference between the times t64 and t54 is the same as the time difference between the times t54 and t44. A time difference between the times t74 and t64 is the same as the time difference between t64 and t54, and a time difference between the times t84 and t74 is the same as the time difference between the times t74 and t64. A time difference between the times t94 and t84 is the same as the time difference between t84 and t74, and a time difference between the times t104 and t94 is the same as the time difference between the times t94 and t84.

It should be noted that the time t is measured in terms of nanoseconds or microseconds. For example, each pulse of a digital pulse signal, described herein, ranges from a few nanoseconds to a few microseconds. As another example, the time t22 (FIGS. 2A and 2B) or t43 (FIGS. 3A-3D) or t54 is a few nanoseconds or a few microseconds.

It should further be noted that the RF generator RFGA is controlled by the processor 108 of FIG. 1 to generate the RF signal 122 that concurrently pulses between multiple parameter levels and between multiple frequency levels during a time period. For example, the RF generator RFGA is controlled by the processor 108 of FIG. 1 to generate the RF signal 122 that pulses between the multiple parameter levels while the RF generator RFGA is controlled by the processor 108 to generate the RF signal 122 that pulses between the multiple frequency levels. To illustrate, the RF generator RFGA generates the RF signal 122 that pulses between the parameter levels PR1, PR2, and PR3 of FIGS. 2A and 2B in response to receiving the digital pulse signal 138 of FIG. 1. The RF signal 122 pulses between the parameter levels PR1 through PR3 during a time period between the times t92 and 0 of FIGS. 2A and 2B. Moreover, the RF generator RFGA generates the RF signal 122 that pulses between the frequency levels f1 and f2 of FIGS. 2A and 2B in response to receiving the digital pulse signal 136 of FIG. 1. The RF signal 122 pulses between the frequency levels f1 and f2 during the time period between the times t92 and 0.

As another illustration, the RF generator RFGA generates the RF signal 122 that pulses between the parameter levels PR11, PR21, PR31, and PR41 of FIGS. 3A-3D in response to receiving the digital pulse signal 138 of FIG. 1. The RF signal 122 pulses between the parameter levels PR11 through PR41 during a time period between the times t123 and 0 of FIGS. 3A-3D. Moreover, the RF generator RFGA generates the RF signal 122 that pulses between the frequency levels f1 and f2 of FIGS. 3A-3D in response to receiving the digital pulse signal 136 of FIG. 1. The RF signal 122 pulses between the frequency levels f1 and f2 during the time period between the times t123 and 0.

As yet another illustration, the RF generator RFGA generates the RF signal 122 that pulses between the parameter levels PR111, PR211, PR311, PR411, and PR511 of FIGS. 4A and 4B in response to receiving the digital pulse signal 138 of FIG. 1. The RF signal 122 pulses between the parameter levels PR111 through PR511 during a time period between the times t104 and 0 of FIGS. 4A and 4B. Moreover, the RF generator RFGA generates the RF signal 122 that pulses between the frequency levels f1 and f2 of FIGS. 4A and 4B in response to receiving the digital pulse signal 136 of FIG. 1. The RF signal 122 pulses between the frequency levels f1 and f2 during the time period between the times t104 and 0.

As still another illustration, with reference to FIG. 2A, the frequency level f1 is pulsed to the frequency level f2 at approximately the same time, such as the time t12 or t42 or t72 or within the pre-defined time period from the time t12 or t42 or t72, at which the parameter level PR1 is pulsed to the parameter level PR2. Moreover, the frequency level f2 is pulsed to the frequency level f1 at approximately the same time, such as the time 0 or t32 or t62 or t92 or t42 or t72 or within the pre-defined time period from the time 0 or t32 or t62 or t92 or t42 or t72, at which the parameter level PR3 is pulsed to the parameter level PR1.

As another illustration, with reference to FIG. 2B, the frequency level f2 is pulsed to the frequency level f1 at approximately the same time, such as the time t12 or t42 or t72 or within the pre-defined time period from the time t12 or t42 or t72, at which the parameter level PR1 is pulsed to the parameter level PR2. Moreover, the frequency level f1 is pulsed to the frequency level f2 at approximately the same time, such as the time 0 or t32 or t62 or t92 or within the pre-defined time period from the time 0 or t32 or t62 or t92, at which the parameter level PR3 is pulsed to the parameter level PRE As yet another illustration, with reference to FIG. 3A, the frequency level f1 is pulsed to the frequency level f2 at approximately the same time, such as the time t13 or t53 or t93 or within the pre-defined time period from the time t13 or t53 or t93, at which the parameter level PR11 is pulsed to the parameter level PR21. Moreover, the frequency level f2 is pulsed to the frequency level f1 at approximately the same time, such as the time 0 or t43 or t83 or t123 or within the pre-defined time period from the time 0 or t43 or t83 or t123, at which the parameter level PR41 is pulsed to the parameter level PR11.

As still another illustration, with reference to FIG. 3B, the frequency level f2 is pulsed to the frequency level f1 at approximately the same time, such as the time t13 or t53 or t93 or within the pre-defined time period from the time t13 or t53 or t93, at which the parameter level PR11 is pulsed to the parameter level PR21. Moreover, the frequency level f1 is pulsed to the frequency level f2 at approximately the same time, such as the time 0 or t43 or t83 or t123 or within the pre-defined time period from the time 0 or t43 or t83 or t123, at which the parameter level PR41 is pulsed to the parameter level PR11.

As yet another illustration, with reference to FIG. 3C, the frequency level f1 is pulsed to the frequency level f2 at approximately the same time, such as the time t23 or t63 or t103 or within the pre-defined time period from the time t23 or t63 or t103, at which the parameter level PR21 is pulsed to the parameter level PR31. Moreover, the frequency level f2 is pulsed to the frequency level f1 at approximately the same time, such as the time 0 or t43 or t83 or t123 or within the pre-defined time period from the time 0 or t43 or t83 or t123, at which the parameter level PR41 is pulsed to the parameter level PR11.

As still another illustration, with reference to FIG. 3D, the frequency level f2 is pulsed to the frequency level f1 at approximately the same time, such as the time t23 or t63 or t103 or within the pre-defined time period from the time t23 or t63 or t103, at which the parameter level PR21 is pulsed to the parameter level PR31. Moreover, the frequency level f1 is pulsed to the frequency level f2 at approximately the same time, such as the time 0 or t43 or t83 or t123 or within the pre-defined time period from the time 0 or t43 or t83 or t123, at which the parameter level PR41 is pulsed to the parameter level PR11.

As yet another illustration, with reference to FIG. 4A, the frequency level f1 is pulsed to the frequency level f2 at approximately the same time, such as the time t34 or t84 or within the pre-defined time period from the time t34 or t84, at which the parameter level PR311 is pulsed to the parameter level PR411. Moreover, the frequency level f2 is pulsed to the frequency level f1 at approximately the same time, such as the time 0 or t54 or t104 or within the pre-defined time period from the time 0 or t54 or t104, at which the parameter level PR511 is pulsed to the parameter level PR111.

As another illustration, with reference to FIG. 4B, the frequency level f2 is pulsed to the frequency level f1 at approximately the same time, such as the time t34 or t84 or t104 or within the pre-defined time period from the time t34 or t84, at which the parameter level PR311 is pulsed to the parameter level PR411. Moreover, the frequency level f1 is pulsed to the frequency level f2 at approximately the same time, such as the time 0 or t54 or t104 or t104 or within the pre-defined time period from the time 0 or t54 or t104 or t104, at which the parameter level PR511 is pulsed to the parameter level PR111.

It should be noted that the terms "at approximately the same time" is sometimes referred to herein as "in substantial synchronization with", and these terms are used interchangeably herein. Moreover, it should further be noted that the frequency of the RF signal 122 pulses concurrently with, such as in substantial synchronization with, the parameter of the RF signal 122. For example, the frequency level f2 is pulsed to the frequency level f1 in substantial synchronization with, such as the time t34 or t84 or t104 or within the pre-defined time period from the time t34 or t84, pulsing from the parameter level PR311 to the parameter level PR411. Moreover, the frequency level f1 is pulsed to the frequency level f2 in substantial synchronization with, such as the time 0 or t54 or t104 or t104 or within the pre-defined time period from the time 0 or t54 or t104 or t104, pulsing from the parameter level PR511 to the parameter level PR111.

It should further be noted that an occurrence of a state of a signal, such as a digital pulse signal or the parameter or the frequency, is a pulse of the signal during a periodic cycle of the signal. For example, with reference to FIG. 2A, an occurrence of the state S1 of the digital pulse signal 204 is a pulse of the digital pulse signal 204 that occurs during the time period between the times t12 and 0. Another occurrence of the state S1 of the digital pulse signal 204 is a pulse of the digital pulse signal 204 that occurs during the time period between the times t42 and t32. Similarly, an occurrence of the state S2 of the digital pulse signal 204 is a pulse of the digital pulse signal 204 that occurs during the time period between the times t22 and t12. An occurrence of the state S3 of the digital pulse signal 204 is a pulse of the digital pulse signal 204 that occurs during the time period between the times t32 and t22. In this manner, there are three occurrences of each of the states S1, S2, and S3 of the digital pulse signal 204 during the time period between the times t92 and 0. Also, there are three occurrences of each of the states S0 and S1 of the digital pulse signal 208 during the time period between the times t92 and 0. Similarly, there are three occurrences of each of the states S1, S2, and S3 of the parameter 212 during the time period between the times t92 and 0 and there are three occurrences of each of the states S0 and S1 of the frequency 216 during the time period between the times t92 and 0.

With reference to FIG. 3A, there are three occurrences of each of the states S1, S2, S3, and S4 of the digital pulse signal 304 during the time period between the times t123 and 0. Similarly, there are three occurrences of each of the states S0 and S1 of the digital pulse signal 308 during the time period between the times t123 and 0. There are three occurrences of each of the states S1, S2, S3, and S4 of the parameter 312 during the time period between the times t123 and 0 and there are three occurrences of each of the states S0 and S1 of the frequency 316 during the time period between the times t123 and 0.

With reference to FIG. 3C, there are three occurrences of each of the states S0 and S1 of the digital pulse signal 328 during the time period between the times t123 and 0. There are three occurrences of each of the states S0 and S1 of the frequency 332 during the time period between the times t123 and 0.

With reference to FIG. 4A, there are two occurrences of each of the states S1, S2, S3, S4, and S5 of the digital pulse signal 404 during the time period between the times t104 and 0. Similarly, there are two occurrences of each of the states S0 and S1 of the digital pulse signal 408 during the time period between the times t104 and 0. There are two occurrences of each of the states S1, S2, S3, S4, and S5 of the parameter 412 during the time period between the times t104 and 0 and there are two occurrences of each of the states S0 and S1 of the frequency 416 during the time period between the times t104 and 0.

In various embodiments, a duty cycle of the frequency 424 is different than that illustrated in FIG. 4B. For example, instead of 60%, a duty cycle of the frequency 424 ranges from and including 20% to 80%.

It should be noted that any parameter level of the RF signal 122 is an envelope, such as a peak-to-peak amplitude or a zero-to-peak amplitude, of multiple parameter values of the RF signal 122. For example, each of the parameter levels PR1, PR2, PR3, PR11, PR21, PR31, PR41, PR111, PR211, PR311, PR411, and PR511 is a peak-to-peak amplitude of magnitudes of the parameter of the RF signal 122.

Similarly, it should be noted that any frequency level of the RF signal 122 is an envelope, such as a peak-to-peak amplitude or a zero-to-peak amplitude, of multiple frequency values of the RF signal 122. For example, each of the frequency levels f1 and f2 is a peak-to-peak amplitude of magnitudes of the frequency of the RF signal 122.

It should be noted that the state S1 of the parameter 212 is the same as the state S1 of the digital pulse signal 204 of FIG. 2A or 2B. Similarly, the state S2 of the parameter 212 is the same as the state S2 of the digital pulse signal 204 of FIG. 2A or 2B and the state S3 of the parameter 212 is the same as the state S3 of the digital pulse signal 204 of FIG. 2A or 2B. Similarly, the state S1 of the parameter 312 of FIG. 3A, or 3B, or 3C, 3D is the same as the state S1 of the digital pulse signal 304 of FIG. 3A, or 3B, or 3C, 3D. Similarly, the state S2 of the parameter 312 is the same as the state S2 of the digital pulse signal 304, the state S3 of the parameter 312 is the same as the state S3 of the digital pulse signal 304, and the state S4 of the parameter 312 is the same as the state S4 of the digital pulse signal 304. The state S1 of the parameter 412 of FIGS. 4A and 4B is the same as the state S1 of the digital pulse signal 404 of FIG. 4A or 4B. Similarly, the state S2 of the parameter 412 is the same as the state S2 of the digital pulse signal 404, the state S3 of the parameter 412 is the same as the state S3 of the digital pulse signal 404, the state S4 of the parameter 412 is the same as the state S4 of the digital pulse signal 404, and the state S5 of the parameter 412 is the same as the state S5 of the digital pulse signal 404.

FIG. 5A is an embodiment of a graph 502 to illustrate an angular distribution, such as a peak energy angular distribution, of ions of plasma within a plasma reactor (not shown) when a continuous wave voltage signal of 200 volts is applied as a bias voltage Vb to a wafer support (not shown) within the plasma reactor. The graph 502 plots energy of ions of plasma within the plasma reactor versus the angular distribution.

FIG. 5B is an embodiment of a graph 504 to illustrate the angular distribution of ions of plasma within the plasma reactor when a continuous wave voltage signal of 400 volts is applied as the bias voltage to the wafer support. The graph 504 plots energy of ions of plasma within the plasma reactor versus the angular distribution.

FIG. 5C is an embodiment of a graph 506 to illustrate the angular distribution of ions of plasma within the plasma reactor when a continuous wave voltage signal of 800 volts is applied as the bias voltage to the wafer support. The graph 506 plots energy of ions of plasma within the plasma reactor versus the angular distribution.

FIG. 5D is an embodiment of a graph 508 to illustrate the angular distribution of ions of plasma within the reactor when a continuous wave voltage signal of 1600 volts is applied as the bias voltage to the wafer support. The graph 508 plots energy of ions of plasma within the reactor versus the angular distribution.

It should be noted that as illustrated in the graphs 502-508, the angular distribution decreases with an increase in a magnitude of a continuous wave voltage signal applied to the wafer support. For example, with an increase in the magnitude of the continuous wave voltage signal from 200 volts to 1600 volts, the angular distribution decreases.

It should further be noted that the RF signal 122 of FIG. 1 is not a continuous wave voltage signal. For example, the RF signal 122 is a pulse signal that pulses between two or more states, such as the states S1 through S5 of the parameter. As another example, a difference between a magnitude of a parameter level of one of the states S1 through S5 of the RF signal 122 is outside the predefined range, such as 20%, compared to a magnitude of a parameter level of another one of the states S1 through S5.

Figure 5E:
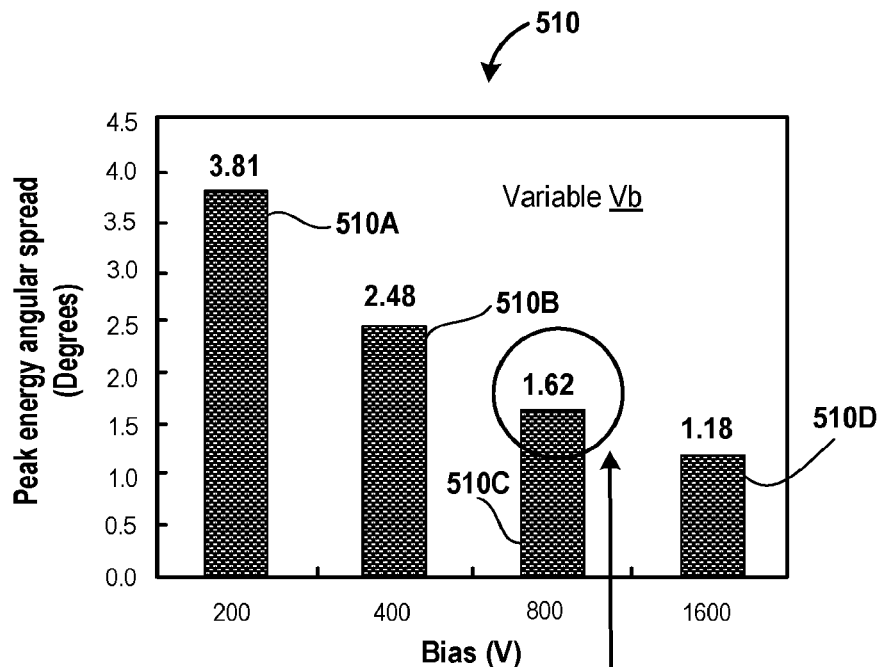
FIG. 5E is an embodiment of a graph to illustrate a decrease in the angular distribution with an increase in a voltage of a continuous wave signal.

FIG. 5E is an embodiment of the graph 510 to illustrate a decrease in the angular distribution with the increase in a voltage of a continuous wave signal. The graph 510 plots the angular distribution versus the bias voltage. A plot 510A of the graph 510 illustrates the angular distribution when the bias voltage of 200 volts is applied to the wafer support. Similarly, a plot 510B of the graph 510 illustrates the angular distribution when the bias voltage of 400 volts is applied to the wafer support, a plot 510C of the graph 510 illustrates the angular distribution when the bias voltage of 800 volts is applied to the wafer support, and a plot 510D of the graph 510 illustrates the angular distribution when the bias voltage of 1600 volts is applied to the wafer support. As shown from the plots 510A to 510D, there is a decrease in the angular distribution with the increase in the bias voltage.

FIG. 5F is an embodiment of a graph 512 to illustrate an energy of ions of plasma within the plasma reactor versus the angular distribution when a continuous wave voltage signal of 300 volts is applied to the wafer support.

FIG. 5G is an embodiment of a graph 514 to illustrate an energy of ions of plasma within the plasma chamber 112 of FIG. 1 when two-level pulsing of the parameter of the RF signal 122 of FIG. 1 is applied to the substrate support 114 (FIG. 1) and the RF signal 122 has the constant frequency level. The graph 514 plots an energy of ions of plasma within the plasma chamber 112 versus the angular spread of the ions within the plasma chamber 112. The two-level pulsing of the RF signal 122 includes pulsing parameter levels the RF signal 122 between the two states S1 and S2 and does not include the states S3 through S5.

FIG. 5H an embodiment of a graph 516 to illustrate an energy of ions of plasma within the plasma chamber 112 of FIG. 1 when three-level pulsing of the parameter of the RF signal 122 of FIG. 1 is applied to the substrate support 114 (FIG. 1) and the RF signal 122 has the constant frequency level. The graph 516 plots an energy of ions of plasma within the plasma chamber 112 versus the angular spread of the ions within the plasma chamber 112. The three-level pulsing of the parameter of the RF signal 122 includes pulsing parameter levels of the RF signal 122 among the three states S1 through S3 and does not include the states S4 through S5. For example, the graph 210 of FIGS. 2A and 2B illustrate the three-level pulsing of the parameter of the RF signal 122. Moreover, the graph 516 is generated when the RF signal 122 has the constant frequency level. For example, a frequency of the RF signal 122 is not pulsed and is continuous.

FIG. 5I is an embodiment of a graph 518 to illustrate an energy of ions of plasma within the plasma chamber 112 of FIG. 1 when three-level pulsing of the parameter of the RF signal 122 of FIG. 1 is applied to the substrate support 114 (FIG. 1) in addition to applying two-level pulsing of the frequency of the RF signal 122. The graph 518 plots an energy of ions of plasma within the plasma chamber 112 versus the angular spread of the ions within the plasma chamber 112. The two-level pulsing of the frequency of the RF signal 122 is pulsing frequency levels the RF signal 122 between the two states S0 and S1. The two-level pulsing of the frequency of the RF signal 122 is illustrated in the graph 214 of FIG. 2A and the graph 222 of FIG. 2B.

FIG. 5J is an embodiment of a graph 520 to illustrate an energy of ions of plasma within the plasma chamber 112 of FIG. 1 when five-level pulsing of the parameter of the RF signal 122 of FIG. 1 is applied to the substrate support 114 (FIG. 1) and the RF signal 122 has the constant frequency level. The graph 520 plots an energy of ions of plasma within the plasma chamber 112 versus the angular spread of the ions within the plasma chamber 112. The five-level pulsing of the parameter of the RF signal 122 is pulsing parameter levels the RF signal 122 among the five states S1 through S5. The five-level pulsing of the parameter of the RF signal 122 is illustrated in the graph 410 of FIGS. 4A and 4B. As illustrated in the graphs 514, 516, 518, and 520, the angular spread at a top of a channel formed within the mask layer is lower than the angular distribution, which is illustrated in the graphs 502, 504, 506, 508, and 512. In addition, energy of ions of plasma within the plasma chamber 112 is lower at a bottom of the channel compared to energy of ions of plasma within the plasma reactor achieved using a continuous wave voltage signal. Furthermore, as illustrated from the graphs 516, 580, and 520, with an increase in the number of levels of the parameter of the RF signal 122, there is an increase in the mask selectivity associated with the substrate 118 of FIG. 1.

Figure 5K:
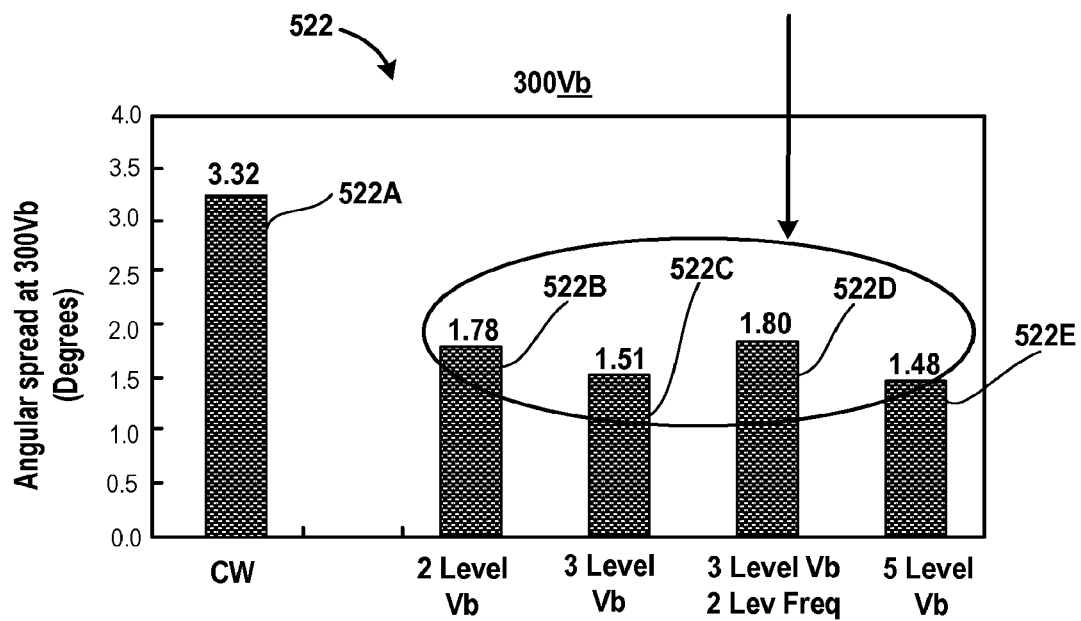
FIG. 5K is an embodiment of a graph to illustrate a comparison between the angular distribution achieved using a continuous wave voltage signal and an angular spread achieved using multi-level pulsing of the parameter of the RF signal.

FIG. 5K is an embodiment of a graph 522 to illustrate a comparison between the angular distribution achieved using a continuous wave voltage signal and the angular spread achieved using multi-level pulsing of the parameter of the RF signal 122. The graph 522 plots the angular distribution for a continuous wave voltage signal and plots the angular spread for multi-level pulsing of the parameter. The graph 522 has a plot 522A of the angular distribution for a continuous wave voltage signal, has a plot 522B of the angular spread for the two-level pulsing of the parameter of the RF signal 122 and the constant frequency level of the RF signal 122, has a plot 522C for the three-level pulsing of the parameter of the RF signal 122 and the constant frequency level of the RF signal 122, has a plot 522D for the three-level pulsing of the parameter of the RF signal 122 and the two-level pulsing of the frequency of the RF signal 122, and has a plot 522E for the five-level pulsing of the RF signal 122 and the constant frequency level of the RF signal 122. It should be noted that the angular spread for any of the plots 522B through 522E is lower than the angular distribution for the plot 522A.

Figures 6A, 6B, 6C, 6D, 6E, 6F:
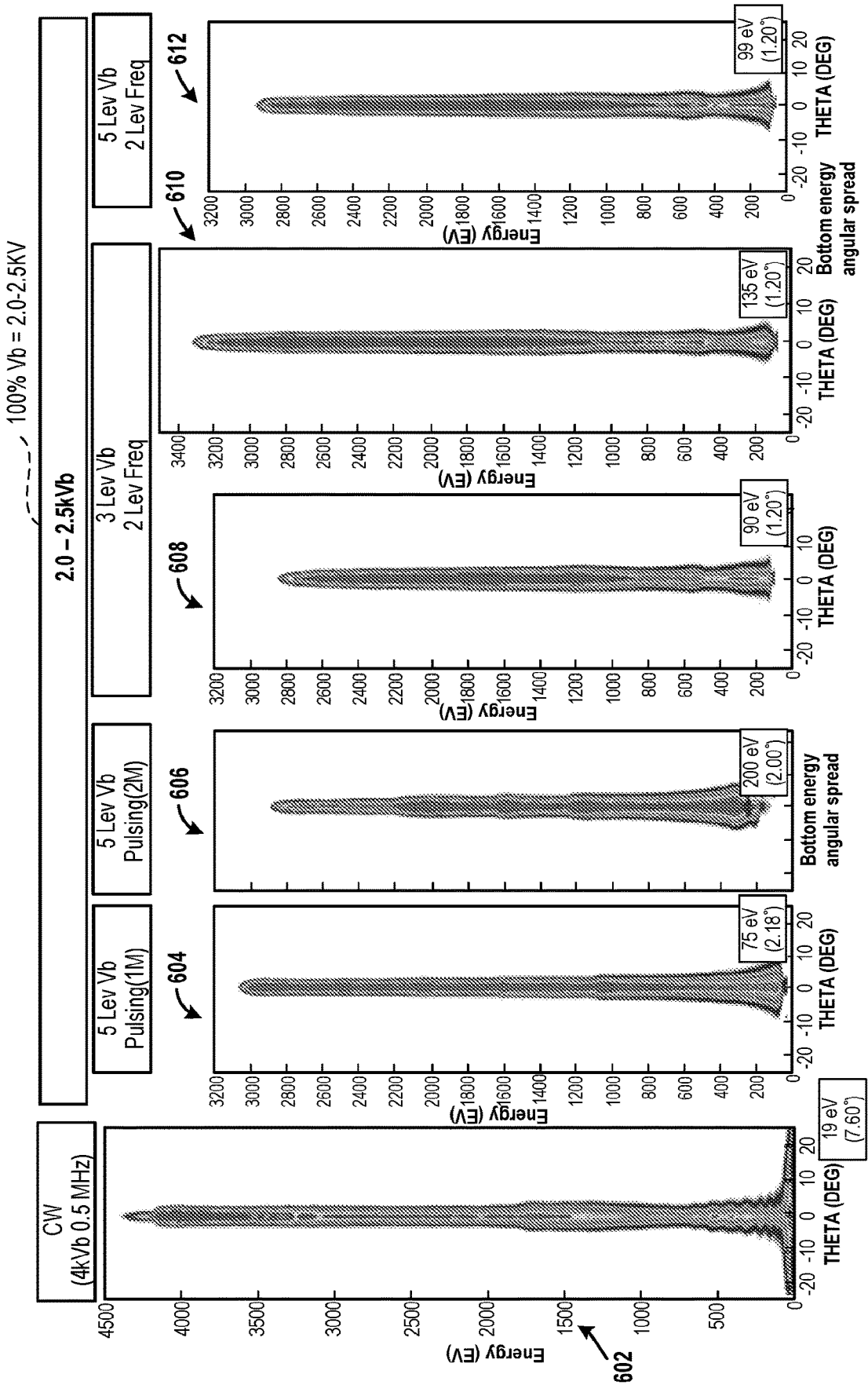
FIG. 6A is an embodiment of a graph that is generated when a continuous wave voltage signal is applied to the wafer support of the plasma reactor.
FIG. 6B is an embodiment of a graph that is generated when the five-level pulsing of the parameter of the RF signal and the constant frequency level of the RF signal are applied to the substrate support.
FIG. 6C is an embodiment of a graph that is generated when the five-level pulsing of the parameter of the RF signal and the constant frequency level of the RF signal are applied to the substrate support.
FIG. 6D is an embodiment of a graph that is generated when the three-level pulsing of the parameter of the RF signal and the two-level pulsing of the frequency of the RF signal are applied to the substrate support.
FIG. 6E is an embodiment of a graph that is generated when the three-level pulsing of the parameter of the RF signal and the two-level pulsing of the frequency of the RF signal are applied to the substrate support.
FIG. 6F is an embodiment of a graph that is generated when the five-level pulsing of the parameter of the RF signal and the two-level pulsing of the frequency of the RF signal are applied to the substrate support.

FIG. 6A is an embodiment of a graph 602 that is generated when a continuous wave voltage signal is applied to the wafer support of the plasma reactor. The graph 602 plots an energy of ions of plasma within the plasma reactor versus an angular distribution of ions of the plasma.

FIG. 6B is an embodiment of a graph 604 that is generated when the five-level pulsing of the parameter of the RF signal 122 (FIG. 1) and the constant frequency level, such as 1 megahertz, of the RF signal 122 are applied to the substrate support 114 of FIG. 1. The graph 604 plots an energy of ions of plasma within the plasma chamber 112 of FIG. 1 versus the angular spread of the ions.

FIG. 6C is an embodiment of a graph 606 that is generated when the five-level pulsing of the parameter of the RF signal 122 (FIG. 1) and the constant frequency level, such as 2 megahertz, of the RF signal 122 are applied to the substrate support 114 of FIG. 1. The graph 606 plots an energy of ions of plasma within the plasma chamber 112 of FIG. 1 versus the angular spread of the ions.

FIG. 6D is an embodiment of a graph 608 that is generated when the three-level pulsing of the parameter of the RF signal 122 (FIG. 1) and the two-level pulsing of the frequency of the RF signal 122 are applied to the substrate support 114 of FIG. 1. The graph 608 plots an energy of ions of plasma within the plasma chamber 112 of FIG. 1 versus the angular spread of the ions.

FIG. 6E is an embodiment of a graph 610 that is generated when the three-level pulsing of the parameter of the RF signal 122 (FIG. 1) and the two-level pulsing of the frequency of the RF signal 122 are applied to the substrate support 114 of FIG. 1. The graph 610 plots an energy of ions of plasma within the plasma chamber 112 of FIG. 1 versus the angular spread of the ions.

FIG. 6F is an embodiment of a graph 612 that is generated when the five-level pulsing of the parameter of the RF signal 122 (FIG. 1) and the two-level pulsing of the frequency of the RF signal 122 are applied to the substrate support 114 of FIG. 1. The graph 612 plots an energy of ions of plasma within the plasma chamber 112 of FIG. 1 versus the angular spread of the ions.

As illustrated from the graphs 602, 604, 606, 608, 610, and 612, the angular spread at the bottom of the channel for multi-level pulsing of the parameter is lower compared to the angular distribution for a continuous wave signal. The angular spread at the bottom of the channel is achieved when multi-level pulsing of the parameter of the RF signal 122 is applied to the substrate support 114 of FIG. 1. Moreover, the angular distribution is achieved when a continuous wave voltage signal is applied to the wafer support of the plasma reactor.

Figures 7A, 7B, 7C, 7D, 7E:
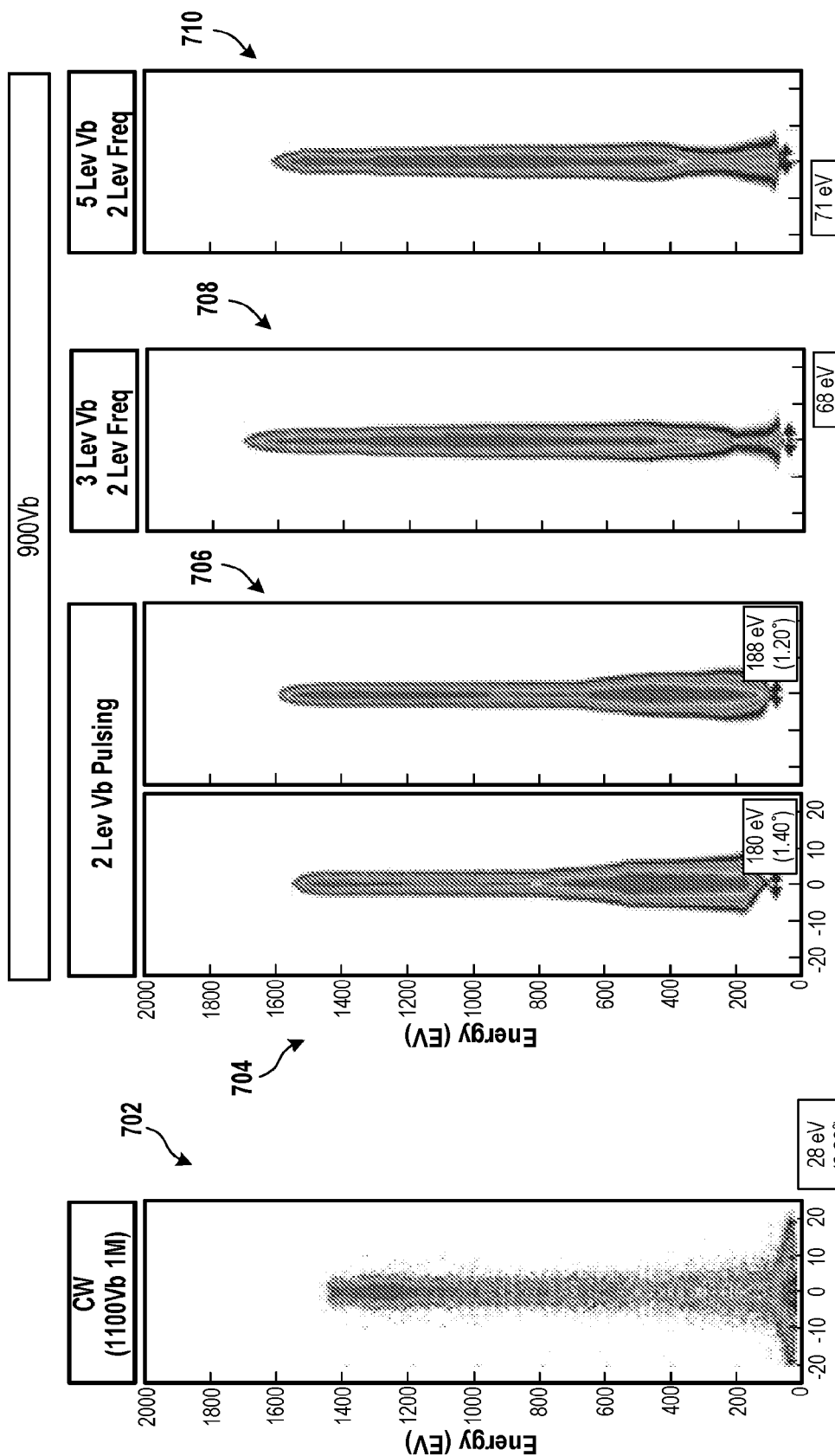
FIG. 7A is an embodiment of a graph that is generated when a continuous wave voltage signal is applied to the wafer support of the plasma reactor.
FIG. 7B is an embodiment of a graph that is generated when the two-level pulsing of the parameter of the RF signal and the constant frequency level of the RF signal are applied to the substrate support.
FIG. 7C is an embodiment of a graph that is generated when the two-level pulsing of the parameter of the RF signal and the constant frequency level of the RF signal are applied to the substrate support.
FIG. 7D is an embodiment of a graph that is generated when the three-level pulsing of the parameter of the RF signal and the two-level pulsing of the frequency of the RF signal are applied to the substrate support.
FIG. 7E is an embodiment of a graph that is generated when the five-level pulsing of the parameter of the RF signal and the two-level pulsing of the frequency of the RF signal are applied to the substrate support.

FIG. 7A is an embodiment of a graph 702 that is generated when a continuous wave voltage signal is applied to the wafer support of the plasma reactor. The graph 702 plots an energy of ions of plasma within the plasma reactor versus the angular distribution of ions of the plasma.

FIG. 7B is an embodiment of a graph 704 that is generated when the two-level pulsing of the parameter of the RF signal 122 (FIG. 1) and the constant frequency level of the RF signal 122 are applied to the substrate support 114 of FIG. 1. The graph 704 plots an energy of ions of plasma within the plasma chamber 112 of FIG. 1 versus the angular spread of the ions.

FIG. 7C is an embodiment of a graph 706 that is generated when the two-level pulsing of the parameter of the RF signal 122 (FIG. 1) and the constant frequency level of the RF signal 122 are applied to the substrate support 114 of FIG. 1. The graph 706 plots an energy of ions of plasma within the plasma chamber 112 of FIG. 1 versus the angular spread of the ions.

FIG. 7D is an embodiment of a graph 708 that is generated when the three-level pulsing of the parameter of the RF signal 122 (FIG. 1) and the two-level pulsing of the frequency of the RF signal 122 are applied to the substrate support 114 of FIG. 1. The graph 708 plots an energy of ions of plasma within the plasma chamber 112 of FIG. 1 versus the angular spread of the ions.

FIG. 7E is an embodiment of a graph 710 that is generated when the five-level pulsing of the parameter of the RF signal 122 (FIG. 1) and the two-level pulsing of the frequency of the RF signal 122 are applied to the substrate support 114 of FIG. 1. The graph 710 plots an energy of ions of plasma within the plasma chamber 112 of FIG. 1 versus the angular spread of the ions. As illustrated from the graphs 702, 704, 706, 708, and 710, the angular spread at the bottom of the channel for multi-level pulsing of the parameter is lower compared to the angular distribution for a continuous wave voltage signal.

FIG. 8A is an embodiment of a graph 802 that plots a direct current (DC) bias at the substrate support 114 of FIG. 1 versus the time t. The graph 802 is plotted when the two-level pulsing of the parameter and the constant frequency level of the RF signal 122 are applied to the substrate support 114.

FIG. 8B is an embodiment of a graph 804 that plots the DC bias at the substrate support 114 of FIG. 1 versus the time t. The graph 804 is plotted when the three-level pulsing of the parameter and the constant frequency level of the RF signal 122 are applied to the substrate support 114.

FIG. 8C is an embodiment of a graph 806 that plots the DC bias at the substrate support 114 of FIG. 1 versus the time t. The graph 806 is plotted when the three-level pulsing of the parameter and the two-level pulsing of the frequency of the RF signal 122 are applied to the substrate support 114.

FIG. 8D is an embodiment of a graph 808 that plots the DC bias at the substrate support 114 of FIG. 1 versus the time t. The graph 808 is plotted when the five-level pulsing of the parameter and the constant frequency level of the RF signal 122 are applied to the substrate support 114. By comparing the graphs 802 through 808, it is shown that with an increase in a number of levels for which the parameter of the RF signal 122 is pulsed, there is an increase in the DC bias. The increase in the DC bias increases a voltage of a plasma sheath of plasma within the plasma chamber 112 of FIG. 1. The increase in the voltage of the plasma sheath enhances energy of ions of plasma within the plasma chamber 112 and the increase in the energy decrease the angular spread of the ions.

A voltage of plasma sheath of plasma within the plasma chamber 112 charges and discharges based on an equation $V_{High\_Peak} = V_{High} + V_{Low} e^{(-t/RC)}$, where $V_{High}$ is a voltage level during a high state, such as the state S3, or S4, or S5, $V_{Low}$ is a voltage level during a low state, such as the state S1 or S2, t is the time, RC is a resistor capacitor (RC) time constant, and $V_{High\_Peak}$ is the voltage of the plasma sheath. As the voltage level increases from the low state to the high state, one plasma sheath develops on another plasma sheath, based on the equation, to form a unified plasma sheath. A cumulative voltage of the unified plasma sheath increases to result in a higher sheath voltage, such as that illustrated in FIGS. 8A through 8D.

FIG. 9A is an embodiment of a graph 902 to illustrate a sheath voltage 902A of plasma formed within the plasma reactor when an RF signal 902B, which is a continuous wave voltage signal, is applied to the wafer support. The graph 902 plots the RF signal 902B versus the time t. As illustrated in the graph 902, the sheath voltage 902A is constant.

FIG. 9B is an embodiment of a graph 904 to illustrate a sheath voltage 904A of plasma formed within the plasma chamber 112 of FIG. 1 when an RF signal 904B is applied to the substrate support 114 of FIG. 1. The graph 904 plots the RF signal 904B versus the time t. The RF signal 904B is an example of the RF signal 122 of FIG. 1. The RF signal 904B illustrates the two-level pulsing of the RF signal 122. For example, the RF signal 904B pulses between a parameter level 908 and another parameter level 910. The RF signal 904B is a sinusoidal signal. The parameter level 910 is greater than the parameter level 908. The parameter level 910 is achieved during the state S1 and the parameter level 908 is achieved during the state S2.

FIG. 9C is an embodiment of a graph 906 to illustrate a sheath voltage 906A of plasma formed within the plasma chamber 112 of FIG. 1 when an RF signal 906B is applied to the substrate support 114 of FIG. 1. The graph 906 plots the RF signal 906B versus the time t. The RF signal 906B is an example of the RF signal 122 of FIG. 1 and is a sinusoidal signal. The RF signal 906B illustrates multi-level pulsing of the parameter of the RF signal 122. For example, the RF signal 906B pulses among a parameter level 912, a parameter level 914, a parameter level 916, and a parameter level 918. The parameter level 918 is greater than the parameter level 916 which is greater than the parameter level 914. The parameter level 914 is greater than the parameter level 912. The parameter level 912 is achieved during the state S1, the parameter level 914 is achieved during the state S2, the parameter level 916 is achieved during the state S3, and the parameter level 918 is achieved during the state S4.

As illustrated with respect to FIGS. 9A through 9C, there is an amplitude modulation of the RF signal 122 due to charging and discharging of plasma sheath of plasma within the plasma chamber 112 of FIG. 1. As a number of parameter levels of the RF signal 122 increases, envelopes, such as the parameter levels 908, 910, 908, 912, 914, 916, and 918, changes with a slower rate that ions of plasma within the plasma chamber 112 can follow and respond to. For example, the sheath voltage 906A increases with a slower rate compared to the sheath voltage 904A. The slower rate of increase in the sheath voltage 906A increases energy of ions within the plasma chamber 112 of FIG. 1. The increase in the energy of ions increases an etch rate of etching the substrate 118 and improves, such as decreases, the critical dimension of the substrate 118.

FIG. 10A is an embodiment of a graph 1002 that plots the DC bias at the substrate support 114 of FIG. 1 generated by the RF signal 122 (FIG. 1) versus the time t. The graph 1002 is generated when multi-level pulsing of the parameter of the RF signal 122 and the constant frequency level of the RF signal 122 are applied to the substrate support 114. It should be noted that the RC time constant of the DC bias plotted in the graph 1002 is approximately 40 microseconds (μs).

FIG. 10B is an embodiment of a graph 1006 that plots the DC bias at the substrate support 114 of FIG. 1 generated by the RF signal 122 (FIG. 1) versus the time t. The graph 1006 is generated when multi-level pulsing of the parameter of the RF signal 122 and the two-level pulsing of the frequency of the RF signal 122 are applied to the substrate support 114. It should be noted that the RC time constant of the DC bias plotted in the graph 1002 is approximately 200 μs. Accordingly, there is an increase in the RC time constant when the frequency of the RF signal 122 is pulsed compared to when the frequency of the RF signal 122 is at the constant frequency level. The increase in the RC time constant facilitates an increase in a sheath voltage of plasma within the plasma chamber 112 of FIG. 1. Moreover, the increase in the RC time constant increases a number of peak energy ions of plasma within the plasma chamber 112. The increase in the number of peak energy ions increases energy of the ions and the increase in the energy increases an etch rate of etching the substrate 118.

As illustrated in FIGS. 10A and 10B, since application of the frequency levels f1 and f2 increases the RC time constant of plasma sheath of plasma within the plasma chamber 112, during a transition from a high parameter level, such as a parameter level during the state S3, or S4, or S5, to a low parameter level, such as the state S1, and during a transition from a high frequency level, such as the frequency level f2, to a low frequency level, such as the frequency level f1, peak energy of ions of plasma within the plasma chamber 112 is sustained longer to increase peak ion energy during the low parameter level and the low frequency level to increase an etch rate for etching the substrate 118 of FIG. 1.

FIG. 11A is an embodiment of a graph 1102 that plots a vertical distance Z, measured in nanometers (nm), versus a horizontal distance R, also measured in nm. The graph 1102 is generated when the continuous wave voltage signal is applied to the wafer support of the plasma reactor. The graph 1102 plots the vertical distance of a mask layer 1102A and the vertical distance of a substrate layer 1102B. The vertical distance of a layer is a height of the layer. Moreover, the graph 1102 plots a critical dimension of a channel formed within the mask layer 1102A during an etch operation. In addition, the graph 1102 plots the critical dimension of the channel formed within the substrate layer 1102B. A critical dimension of a channel formed within a layer is a thickness th, which is measured in nm, of the channel.

FIG. 11B is an embodiment of a graph 1104 that plots the vertical distance Z versus the horizontal distance R. The graph 1104 is generated when the two-level pulsing of the parameter of the RF signal 122 of FIG. 1 and the constant frequency level are applied to the substrate support 114 of FIG. 1. The graph 1104 plots the vertical distance of a mask layer 1104A of the substrate 118 of FIG. 1 and the vertical distance of a substrate layer 1104B of the substrate 118. Moreover, the graph 1104 plots the critical dimension of a channel formed within the mask layer 1104A during an etch operation. In addition, the graph 1104 plots the critical dimension of the channel formed within the substrate layer 1104B.

FIG. 11C is an embodiment of a graph 1106 that plots the vertical distance Z versus the horizontal distance R. The graph 1106 is generated when the three-level pulsing of the parameter of the RF signal 122 of FIG. 1 and the constant frequency level are applied to the substrate support 114 of FIG. 1. The graph 1106 plots the vertical distance of a mask layer 1106A of the substrate 118 of FIG. 1 and the vertical distance of a substrate layer 1106B of the substrate 118. Moreover, the graph 1106 plots the critical dimension of a channel formed within the mask layer 1106A during an etch operation. In addition, the graph 1106 plots the critical dimension of the channel formed within the substrate layer 1106B.

FIG. 11D is an embodiment of a graph 1108 that plots the vertical distance Z versus the horizontal distance R. The graph 1108 is generated when the three-level pulsing of the parameter of the RF signal 122 of FIG. 1 and the two-level pulsing of the frequency of the RF signal 122 are applied to the substrate support 114 of FIG. 1. The graph 1108 plots the vertical distance of a mask layer 1108A of the substrate 118 of FIG. 1 and the vertical distance of a substrate layer 1108B of the substrate 118. Moreover, the graph 1108 plots the critical dimension of a channel formed within the mask layer 1108A during an etch operation. In addition, the graph 1108 plots the critical dimension of the channel formed within the substrate layer 1108B.

FIG. 11E is an embodiment of a graph 1110 that plots the vertical distance Z versus the horizontal distance R. The graph 1110 is generated when the five-level pulsing of the parameter of the RF signal 122 of FIG. 1 and the constant frequency level of the RF signal 122 are applied to the substrate support 114 of FIG. 1. The graph 1110 plots the vertical distance of a mask layer 1110A of the substrate 118 of FIG. 1 and the vertical distance of a substrate layer 1110B of the substrate 118. Moreover, the graph 1110 plots the critical dimension of a channel formed within the mask layer 1110A during an etch operation. In addition, the graph 1110 plots the critical dimension of the channel formed within the substrate layer 1110B.

It should be noted that multi-level pulsing of the parameter of the RF signal 122 in conjunction with the constant frequency level or in conjunction with the two-level pulsing of the frequency of the RF signal 122 increases an etch rate of etching the substrate 122 of FIG. 1 during an etch operation. Moreover, multi-level pulsing of the parameter of the RF signal 122 in conjunction with the constant frequency level or in conjunction with the two-level pulsing of the frequency of the RF signal 122 decreases a critical dimension of a channel formed within the mask layer of the substrate 118 compared to the critical dimension of the channel formed within the mask layer 1102A of FIG. 11A. Moreover, multi-level pulsing of the parameter of the RF signal 122 in conjunction with the constant frequency level or in conjunction with the two-level pulsing of the frequency of the RF signal 122 decreases the critical dimension of a channel formed within the substrate layer of the substrate 118 compared to the critical dimension of the channel formed within the substrate layer 1102B of FIG. 11A.

FIG. 11F is an embodiment of a graph 1112 that plots the vertical distance of a mask layer 1112A versus the horizontal distance of the mask layer 1112A. It should be noted that the mask layer 1112A is not yet processed, such as etched.

FIG. 11G is an embodiment of a graph 1114 that plots the vertical distance of the mask layer 1102A versus the horizontal distance of the mask layer 1102A. The graph 1114 is generated when the continuous wave voltage signal is applied to the wafer support of the plasma reactor. Moreover, the graph 1114 plots the critical dimension of the channel formed within the mask layer 1102A during an etch operation.

FIG. 11H is an embodiment of a graph 1116 that plots the vertical distance of the mask layer 1104A versus the horizontal distance of the mask layer 1104A. The graph 1116 is generated when the two-level pulsing of the parameter of the RF signal 122 of FIG. 1 and the constant frequency level are applied to the substrate support 114 of FIG. 1. Moreover, the graph 1116 plots the critical dimension of the channel formed within the mask layer 1104B during an etch operation.

FIG. 11I is an embodiment of a graph 1118 that plots the vertical distance of the mask layer 1106A versus the horizontal distance of the mask layer 1106A. The graph 1118 is generated when the three-level pulsing of the parameter of the RF signal 122 of FIG. 1 and the constant frequency level are applied to the substrate support 114 of FIG. 1. Moreover, the graph 1118 plots the critical dimension of the channel formed within the mask layer 1106A during an etch operation.

FIG. 11J is an embodiment of a graph 1120 that plots the vertical distance of the mask layer 1108A versus the horizontal distance of the mask layer 1108A. The graph 1120 is generated when the three-level pulsing of the parameter of the RF signal 122 of FIG. 1 and the two-level pulsing of the frequency of the RF signal 122 are applied to the substrate support 114 of FIG. 1. Moreover, the graph 1120 plots the critical dimension of the channel formed within the mask layer 1108A during an etch operation.

FIG. 11K is an embodiment of a graph 1122 that plots the vertical distance of the mask layer 1110A versus the horizontal distance of the mask layer 1110A. The graph 1112 is generated when the five-level pulsing of the parameter of the RF signal 122 of FIG. 1 and the constant frequency level of the RF signal 122 are applied to the substrate support 114 of FIG. 1. Moreover, the graph 1122 plots the critical dimension of the channel formed within the mask layer 1110A during an etch operation.

It should be noted that multi-level pulsing of the parameter of the RF signal 122 in conjunction with the constant frequency level or in conjunction with the two-level pulsing of the frequency of the RF signal 122 increases mask selectivity during an etch operation. For example, the critical dimension of the channel of the mask layer of the substrate 118 of FIG. 1 decreases when multi-level pulsing of the parameter of the RF signal 122 is applied in conjunction with the constant frequency level or in conjunction with the two-level pulsing of the frequency of the RF signal 122. The critical dimension of the channel of the mask layer of the substrate 118 of FIG. 1 decreases compared to the critical dimension of the channel of the mask layer 1102A of FIG. 11G.

FIG. 11L is an embodiment of a graph 1124 to illustrate a decrease in mask erosion when multi-level pulsing of the parameter of the RF signal 122 is applied in conjunction with the constant frequency level or in conjunction with the two-level pulsing of the frequency of the RF signal 122. The graph 1124 has a plot 1124A, which is generated when the continuous wave voltage signal is applied to the wafer support of the plasma reactor. In addition, the graph 1124 has another plot 1124B, which is generated when the two-level pulsing of the parameter of the RF signal 122 of FIG. 1 and the constant frequency level are applied to the substrate support 114 of FIG. 1. Moreover, the graph 1124 has another plot 1124C that is produced when the three-level pulsing of the parameter of the RF signal 122 of FIG. 1 and the constant frequency level are applied to the substrate support 114 of FIG. 1.

Also, the graph 1124 has a plot 1124D that is generated when the three-level pulsing of the parameter of the RF signal 122 of FIG. 1 and the two-level pulsing of the frequency of the RF signal 122 are applied to the substrate support 114 of FIG. 1. In addition, the graph 1124 has a plot 1124E generated when the five-level pulsing of the parameter of the RF signal 122 of FIG. 1 and the constant frequency level of the RF signal 122 are applied to the substrate support 114 of FIG. 1.

It should be noted that there is the decrease in an erosion of the mask layer of the substrate 118 of FIG. 1 compared to an erosion of the mask layer 1102A of FIG. 11G. The decrease in the erosion occurs when multi-level pulsing of the parameter of the RF signal 122 is applied in conjunction with the constant frequency level or in conjunction with the two-level pulsing of the frequency of the RF signal 122.

In some embodiments, each parameter level, described herein, of an RF signal, is an envelope of the RF signal. For example, a parameter level, described herein, of an RF signal is a zero-to-peak magnitude of the RF signal or a peak-to-peak magnitude of the RF signal.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A method comprising:
controlling a first radio frequency (RF) generator to generate a first RF signal;
controlling a parameter of the first RF signal to pulse among a plurality of parameter levels in a repeated manner, wherein the plurality of parameter levels include a first parameter level, a second parameter level, and a third parameter level; and
controlling a frequency of the first RF signal to pulse from a first frequency level to a second frequency level in a repeated manner, wherein the second frequency level is greater than the first frequency level by a preset range, wherein the frequency of the first RF signal is controlled to pulse from the first frequency level to the second frequency level to achieve the preset range while said controlling the parameter of the first RF signal to pulse from the first parameter level to the second parameter level, wherein the frequency of the first RF signal is controlled to be maintained at the second frequency level while said controlling the parameter of the first RF signal to pulse from the second parameter level to the third parameter level.

2. The method of claim 1, wherein the first RF generator is coupled to a substrate support via a first impedance match, the method further comprising:
controlling a second RF generator to generate a second RF signal, wherein the second RF signal is a continuous wave, wherein the second RF generator is coupled to a transformer coupled plasma (TCP) coil via a second impedance match, wherein the second RF generator is controlled while said controlling the parameter of the first RF signal to pulse among the plurality of parameter levels.

3. The method of claim 1, wherein the plurality of parameter levels repeat during each cycle of a digital pulse signal, and the plurality of frequency levels repeat during each cycle of the digital pulse signal.

4. The method of claim 1, wherein the frequency of the first RF signal is controlled to pulse from the first frequency level to the second frequency level simultaneously with pulsing of the parameter of the first RF signal from the first parameter level to the second parameter level.

5. The method of claim 4, wherein the second parameter level is greater than the first parameter level.

6. The method of claim 1, wherein the parameter is power or voltage.

7. The method of claim 1, wherein the plurality of parameter levels are controlled to increase in a stepwise manner with an increase in the plurality of frequency levels.

8. The method of claim 1,
wherein said controlling the parameter of the first RF signal to pulse among the plurality of parameter levels in the repeated manner includes:
controlling the parameter of the first RF signal to pulse among the plurality of parameter levels during a first time period;
controlling the parameter of the first RF signal to pulse among the plurality of parameter levels during a second time period,
wherein said controlling the frequency of the first RF signal to pulse between the plurality of frequency levels in the repeated manner includes:
controlling the frequency of the first RF signal to pulse from the first frequency level to the second frequency level during the first time period;
controlling the frequency of the first RF signal to pulse from the first frequency level to the second frequency level during the second time period.

9. The method of claim 1, wherein the frequency of the first RF signal is controlled to be maintained at the one of the plurality of frequency levels after said controlling the parameter of the first RF signal to pulse from the first parameter level to the second parameter level.

10. The method of claim 1, wherein the preset range is at least twenty percent.

11. The method of claim 1, wherein the preset range is twenty percent.

12. A controller comprising:
a processor configured to control a first radio frequency (RF) generator to generate a first RF signal,
wherein the processor is configured to control the first RF generator to pulse a parameter of the first RF signal among a plurality of parameter levels in a repeated manner, wherein the plurality of parameter levels include a first parameter level, a second parameter level, and a third parameter level,
wherein the processor is configured to control the first RF generator to pulse a frequency of the first RF signal from a first frequency level to a second frequency level in a repeated manner, wherein the second frequency level is greater than the first frequency level by a preset range,
wherein the first RF generator is controlled to pulse the frequency of the first RF signal from the first frequency level to the second frequency level to achieve the preset range while the first RF generator is controlled to pulse the parameter of the first RF signal from the first parameter level to the second parameter level, wherein the frequency of the first RF signal is controlled to be maintained at the second frequency level while the parameter of the first RF signal is controlled to pulse from the second parameter level to the third parameter level; and
a memory device coupled to the processor.

13. The controller of claim 12, wherein the first RF generator is coupled to a substrate support via a first impedance match, wherein the processor is configured to:
control a second RF generator to generate a second RF signal, wherein the second RF signal is a continuous wave, wherein the second RF generator is coupled to a transformer coupled plasma (TCP) coil via a second impedance match, wherein the second RF generator is controlled while the first RF generator is controlled to pulse the parameter of the first RF signal among the plurality of parameter levels.

14. The controller of claim 12, wherein the plurality of parameter levels repeat during each cycle of a digital pulse signal, and the plurality of frequency levels repeat during each cycle of the digital pulse signal.

15. The controller of claim 12, wherein the first RF generator is controlled to pulse the frequency of the first RF signal from the first frequency level to the second frequency level simultaneously with controlling the first RF generator to pulse the parameter of the first RF signal from the first parameter level to the second parameter level.

16. The controller of claim 15, wherein the second parameter level is greater than the first parameter level.

17. The controller of claim 12, wherein the parameter is power or voltage.

18. The controller of claim 12, wherein the first RF generator is controlled to increase the plurality of parameter levels in a stepwise manner with an increase in the plurality of frequency levels.

19. A plasma tool comprising:
a first radio frequency (RF) generator;
a first impedance matching circuit coupled to the first RF generator;
a plasma chamber having a substrate support coupled to the impedance matching circuit; and
a host computer coupled to the first RF generator, wherein the host computer is configured to:
control the first RF generator to generate a first RF signal;
control the first RF generator to pulse a parameter of the first RF signal among a plurality of parameter levels in a repeated manner, wherein the plurality of parameter levels include a first parameter level, a second parameter level, and a third parameter level,
control the first RF generator to pulse a frequency of the first RF signal from a first frequency level to a second frequency level in a repeated manner, wherein the second frequency level is greater than the first frequency level by a preset range, wherein the first RF generator is controlled to pulse the frequency of the first RF signal from the first frequency level to the second frequency level to achieve the preset range while the first RF generator is controlled to pulse the parameter of the first RF signal from the first parameter level to the second parameter level, wherein the frequency of the first RF signal is controlled to be maintained at the second frequency level while the parameter of the first RF signal is controlled to pulse from the second parameter level to the third parameter level.

20. The plasma tool of claim 19, further comprising:
a second RF generator;
a second impedance matching circuit coupled to the second RF generator,
wherein the plasma chamber is associated with a transformer coupled plasma (TCP) coil, wherein second impedance matching circuit is coupled to the TCP coil,
wherein the host computer is configured to control the second RF generator to generate a second RF signal, wherein the second RF signal is a continuous wave, wherein the second RF generator is controlled to generate the continuous wave while the first RF generator is controlled to pulse the parameter of the first RF signal among the plurality of parameter levels.

21. The plasma tool of claim 19, wherein the plurality of parameter levels repeat during each cycle of a digital pulse signal, and the plurality of frequency levels repeat during each cycle of the digital pulse signal.

22. The plasma tool of claim 19, wherein the first RF generator is controlled to pulse the frequency of the first RF signal from the first frequency level to the second frequency level simultaneously with controlling the first RF generator to pulse the parameter of the first RF signal from the first parameter level to the second parameter level.

23. The plasma tool of claim 22, wherein the second parameter level is greater than the first parameter level.

24. The plasma tool of claim 19, wherein the parameter is power or voltage.

25. The plasma tool of claim 19, wherein the first RF generator is controlled to increase the plurality of parameter levels in a stepwise manner with an increase in the plurality of frequency levels.

* * * * *